(12) United States Patent
Nishida et al.

(10) Patent No.: US 6,204,184 B1
(45) Date of Patent: Mar. 20, 2001

(54) METHOD OF MANUFACTURING SEMICONDUCTOR DEVICES

(75) Inventors: Akio Nishida, Tachikawa; Kikuo Kusukawa, Yoshikawa; Toshiaki Yamanaka, Iruma; Natsuki Yokoyama, Mitaka; Shinichiro Kimura, Kunitachi; Norio Suzuki, Mito; Osamu Tsuchiya, Hamura; Atsushi Ogishima, Tachikawa, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/276,969

(22) Filed: Mar. 26, 1999

(30) Foreign Application Priority Data

Mar. 30, 1998 (JP) .................................. 10-083236
Mar. 19, 1999 (JP) .................................. 11-074999

(51) Int. Cl.⁷ .................................................. H01L 21/302
(52) U.S. Cl. .......................................... 438/692; 438/695
(58) Field of Search .......................... 438/692, 690, 438/691, 693, 424, 425, 426, 435, 436; 216/38

(56) References Cited

U.S. PATENT DOCUMENTS

| 5,540,811 | * | 7/1996 | Morita ................... | 156/636.1 |
| 5,851,899 | * | 1/2000 | Weigand ................ | 438/692 |
| 5,863,828 | * | 1/1999 | Snyder .................. | 438/692 |
| 5,926,722 | * | 7/1999 | Jang et al. ............ | 438/692 |
| 5,928,960 | * | 7/1999 | Greco et al. .......... | 438/692 |
| 6,010,931 | * | 1/2000 | Sun et al. .............. | 438/240 |

FOREIGN PATENT DOCUMENTS

| 6-295908 | 10/1994 | (JP) . |
| 7-235537 | 9/1995 | (JP) . |
| 7-263537 | 10/1995 | (JP) . |
| 8-008216 | 1/1996 | (JP) . |
| 10-135211 | 5/1998 | (JP) . |
| 10-321625 | 12/1998 | (JP) . |
| 10-321628 | 12/1998 | (JP) . |
| 83102442 | 9/1995 | (TW) . |

\* cited by examiner

*Primary Examiner*—Benjamin Utech
*Assistant Examiner*—Duy-Vu Deo
(74) *Attorney, Agent, or Firm*—Mattingly, Stanger & Malur, P.C.

(57) ABSTRACT

In a method of manufacturing a semiconductor device having a memory mat portion in which an active region and a field region are formed densely, after a polishing stopper film is deposited on a semiconductor substrate, there are formed grooves by etching a polishing stopper film of a field region and the semiconductor substrate. Then, after an insulating film is deposited so as to fill the grooves, the insulating film is partly removed from the memory mat portion by etching. Under this state, the insulating film is chemically mechanically polished until the polishing stopper film is exposed. The film thickness of the polishing stopper film on the active region can be reduced, and an electrical element isolation characteristic of the field region can be improved. At the same time, upon chemical mechanical polishing, a silicon substrate can be prevented from being exposed at the central portion of the memory mat portion and the insulating film can be prevented from being left on the silicon nitride film near the outer periphery, thereby making it possible to form elements having uniform electrical characteristics on all active regions of the memory mat portion.

9 Claims, 25 Drawing Sheets

MEMORY MAT PORTION — PERIPHERAL CIRCUIT PORTION

METHOD OF MANUFACTURING SEMICONDUCTOR DEVICES

BACKGROUND OF THE INVENTION

The present invention relates to a method of making surfaces of processed products smooth, and particularly to a method of making surfaces of semiconductor devices smooth by filling concavities of uneven surfaces of semiconductor devices with an insulating film material.

Abrasive techniques have been so far used for processing the surface of optical glass. In the field of semiconductor devices, abrasive techniques have been used to make the surface of substrate become mirror finished. According to recent techniques, when the surface of interlayer insulators in the process of forming a multilayer interconnection is made smooth, abrasive techniques are applied to make the surface of the substrate smooth after a buried insulating film is formed in the trench isolation. In the isolation process, in particular, since the size of a device isolation region that can be realized by a prior-art selection oxide film is limited, the trench isolation using abrasive techniques has been indispensable for the planarization process of the surface of the semiconductor devices.

As a method of forming a trench isolation using an abrasive technique for making the surface of a semiconductor device smooth, there has been proposed a method (see JP-A-6-295908, laid-open on Oct. 21, 1994) in which a first stopper layer is formed on the surface of convex portions of a semiconductor substrate having concavities and convexities on its surface, a buried insulating film is deposited on the concavities of the surface of the substrate, a second stopper layer is selectively formed on the surface of the concavities of the buried insulating film and the above-mentioned buried insulating film is removed until the surface of the first stopper layer is exposed by the planarization abrasive technique.

Also, in order to make the surface of the substrate become smoother, there are known techniques disclosed in JP-A-7-263537, laid-open on Oct. 13, 1995, and JP-A-8-8218, laid-open on Jan. 12, 1996.

SUMMARY OF THE INVENTION

The inventors of the present application obtained the following knowledge after research and examination.

When the uneven surface of the semiconductor substrate is made smooth by the planarization abrasive technique, it is to be appreciated that a focusing margin required by the next photolithography process is progressively reduced in accordance with the microminituarization.

According to an example of planarization methods that have been implemented by the inventors of the present invention, as shown in FIGS. 2a to 2f, an interlayer insulator 205 is deposited on concavities and convexities 202, 203, 204 (FIG. 2a) of the surface of a semiconductor substrate 201 (FIG. 2b). Then, after a resist film 206 is formed and processed by patterning, a polished interlayer insulator (205) on a relatively large convex portion 204 is etched in advance by photolithography and dry etching (FIGS. 2c to 2e).

When the surface of the semiconductor substrate is made smooth by dry etching and chemical mechanical polishing, as shown in FIG. 3a, corner portions 306 are left on the peripheral portion of the convex portion of the semiconductor substrate so that, as shown in FIG. 3c, polishing slurries 310 are collected between a region surrounded by the corners 306 and a polishing pad 309, thereby resulting in an etching rate of this region 305 being increased. There is then the risk that a surface 209 of the convex portion will be exposed as shown in FIG. 2f. FIG. 3b is a plan view of the polished surface.

The above-mentioned problem can be solved by using a semiconductor device manufacturing method shown in FIGS. 1a to 1f according to an aspect of the present invention. That is, after an interlayer insulator 105 is deposited on concave and convex structures 102, 103, 104 (FIG. 2a) formed on a semiconductor surface 101 (FIG. 1b), by using a conventional photolithography technique, the interlayer insulator 105 is etched to leave an interlayer insulator 107 (pillar) cyclically while an island-like or line-like resist 106 is left within the region of the wide convex portion 104 (FIGS. 1c, 2d). Here, the size and interval of the pillar are changed with the area of the convex portion. When the surface of the semiconductor substrate is processed by chemical mechanical polishing, polishing slurries can be suppressed from being collected in the region surrounded by corners 108. Therefore, it is possible to control the excessive etching in a polished region 109 of the convex portion (FIGS. 1e, 1f).

DETAILED DESCRIPTION OF THE EMBODIMENTS

Embodiment 1

Figure 1A:
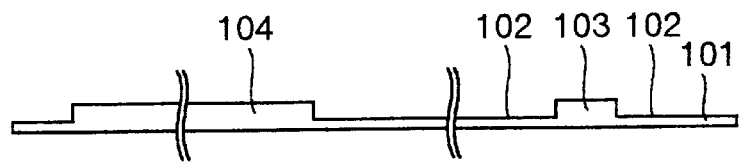
FIGS. 1a to 1f are cross-sectional views showing respective stages in a method of manufacturing semiconductor devices according to an embodiment of the present invention.
Figure 1B:
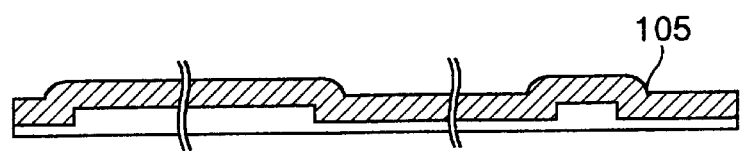
Figure 1C:
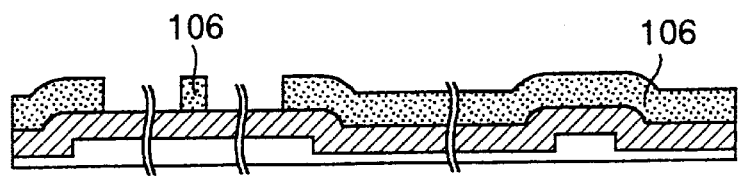

An inventive example 1 will be described with reference to FIGS. 1a to 1f. A silicon substrate 101 (FIG. 1a) in which a difference in step between convex portions 103, 104 serving as active regions and a concave portion 102 serving as a field region was cleaned by RCA cleaning, and a silicon oxide film 105 having a thickness of approximately 350 nano-meter was deposited on the silicon substrate by chemical vapor deposition (hereinafter simply referred to as CVD) (FIG. 1b). Then, by a resist 106, an opening portion was formed on a wide semiconductor region 104. In that case, the resist 106 was left so as to form a pillar 107. (FIG. 1c).

Figure 1D:
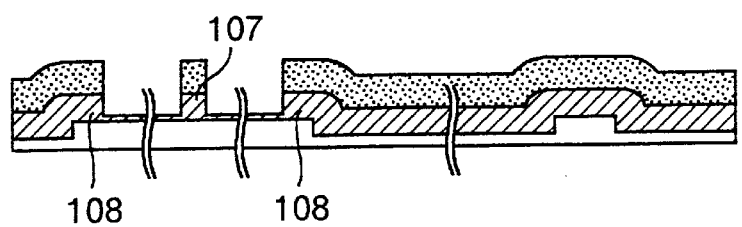
Figure 1E:
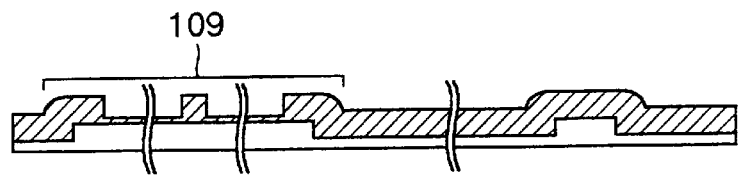
Figure 1F:
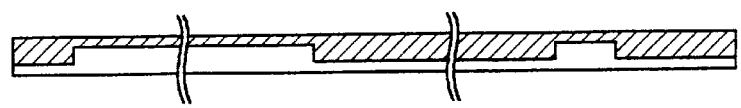

Thereafter, the resist opening portion and the silicon oxide film were etched by dry etching having a high selection ratio between silicon and silicon oxide film (FIG. 1d). At that time, etching conditions were set in such a manner that the film thickness of the remaining silicon oxide film became the same as the height of the surface of the silicon oxide film of the wide field portion. The resist 106 was removed by organic cleaning (FIG. 1e), and the above-mentioned sample was made smooth by polishing. In the chemical mechanical polishing, the sample was polished by using a foamed polyurethane pad and ammonium-based fumed silica slurry with a polishing load of 500 g/cm$^2$ at a turntable revolution rate of 20 revolutions/minute (relative velocity: 20 m/minute) during a polishing time of 6 minutes (FIG. 1f).

Figure 2A:
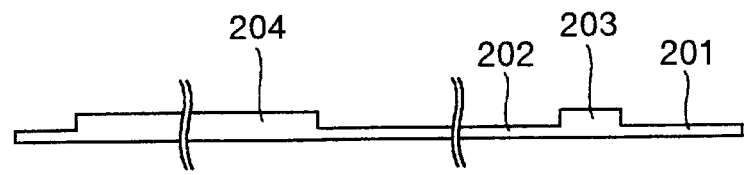
FIGS. 2a to 2f and FIGS. 3a and 3c are cross-sectional views showing respective stages in an example of a semiconductor substrate surface planarization method executed by the present inventors prior to the present invention.
Figure 2B:
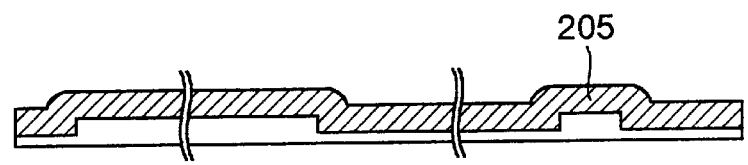
Figure 2C:
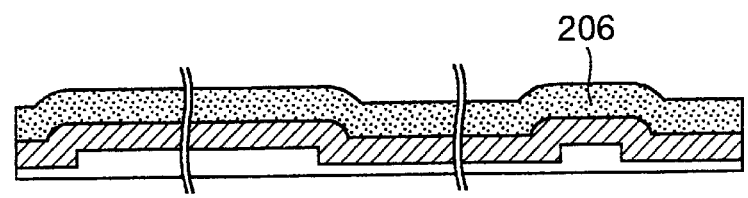
Figure 2D:
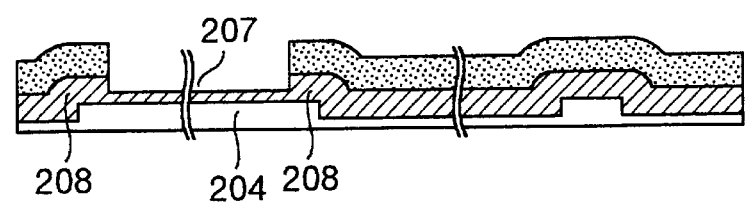
Figure 2E:
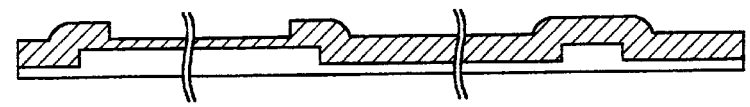
Figure 2F:
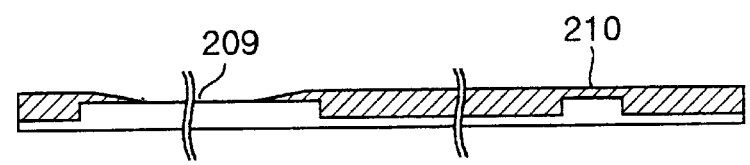
Figure 3A:
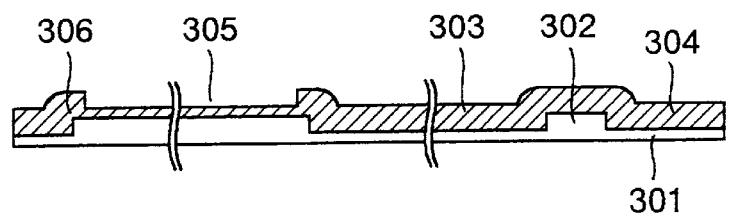
Figure 3B:
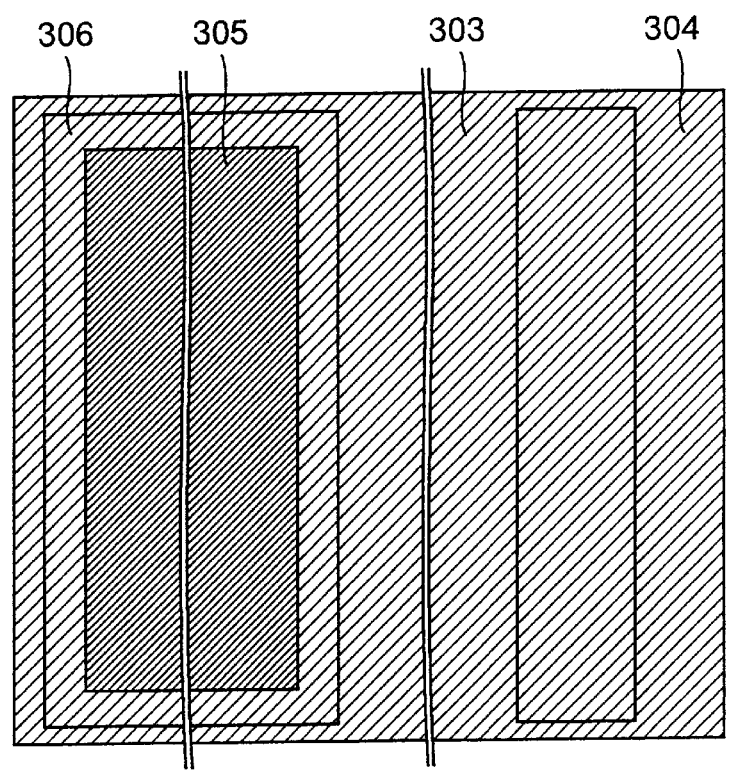
FIG. 3b is a plan view showing a polishing surface in FIG. 3c.
Figure 3C:
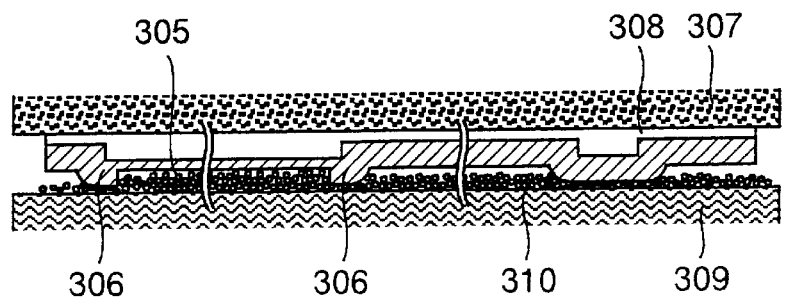

According to this inventive example, it became possible to make the uneven semiconductor surface 101 smooth. In the conventional method, the semiconductor surface 209 was exposed at the central portion of the wide active region 204 due to dishing (FIG. 2f) and could not made smooth. However, according to this inventive example, the semiconductor surface could be made smooth within a step difference of several 10 s of nano-meter.

Embodiment 2

Figure 4A:
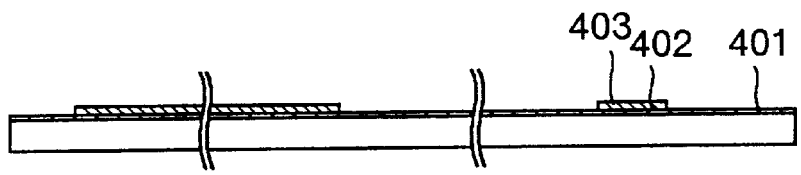
FIGS. 4a to 4e and FIGS. 5a to 5d are cross-sectional views showing respective stages in a method of manufacturing semiconductor devices according to another embodiment of the present invention.
Figure 4B:
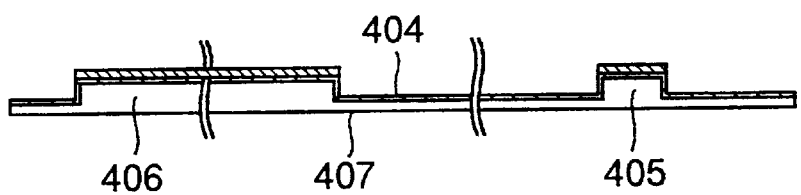

An inventive example 2 will be described with reference to FIGS. 4a to 4e and FIGS. 5a to 5d. After a silicon substrate 401 that had been cleaned by RCA cleaning was oxidized and a silicon oxide film 402 having a thickness of approximately 50 nano-meter, a silicon nitride film 403 having a film thickness of 150 nanometer was deposited by CVD. Then, a resist pattern was formed on the element forming region of the silicon nitride film surface (FIG. 4a). This resist pattern was used as an etching mask, and the silicon nitride film 403, the thermal oxide film 402 and the silicon substrate 401 were etched by a depth of approximately 0.3 micron from the surface by dry etching (FIG. 4b).

Figure 4C:
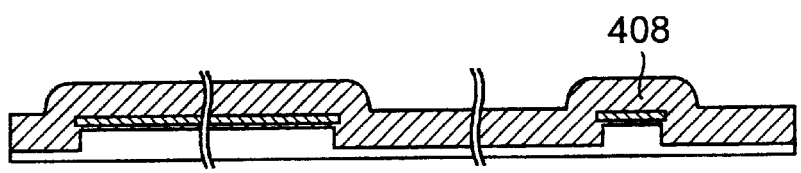
Figure 4D:
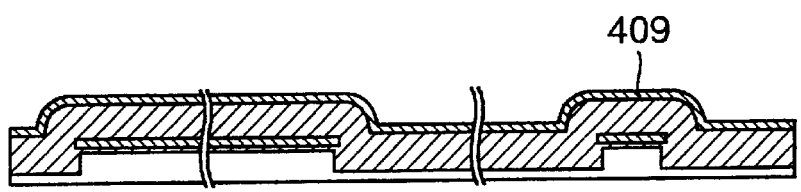
Figure 4E:
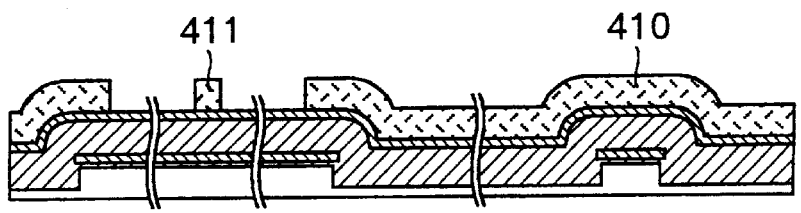

After the above-mentioned substrate was cleaned, a thermal oxide film 404 having a film thickness of approximately 30 nano-meter was formed within the silicon groove by thermal oxidation. Further, a silicon oxide film 408 having a film thickness of 150 nano-meter was deposited (FIG. 4c). Then, a silicon nitride film 409 having a film thickness of 150 nano-meter was deposited (FIG. 4d), and a resist 411 for forming a pillar 411 was formed on a convex portion 406 by patterning as shown in FIG. 4e.

Figure 5A:
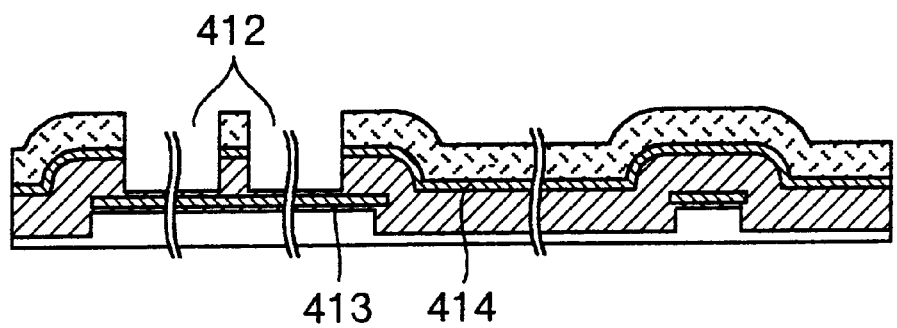
Figure 5B:
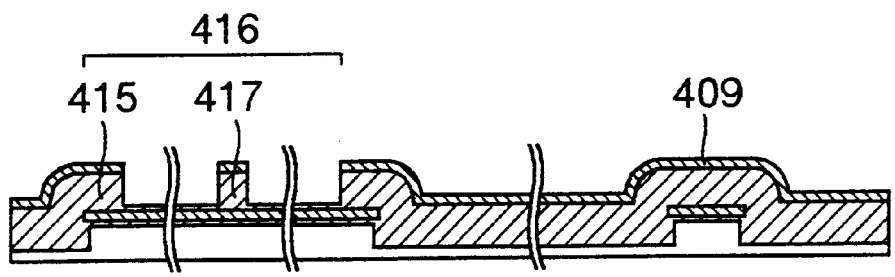
Figure 5C:
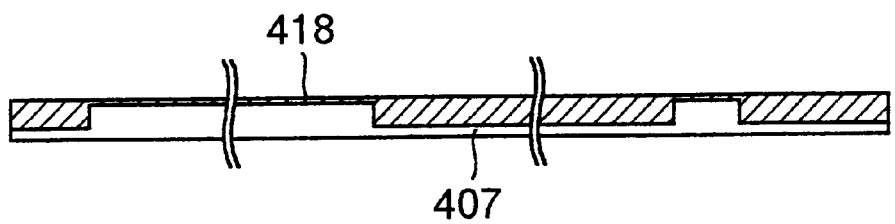

Thereafter, the silicon nitride film 409 of the resist opening portion 412 and the silicon oxide film 408 between the layers were etched by dry etching (FIG. 5a). In this case, the remaining film thickness 413 of the silicon oxide film formed on the convex portion was selected to be the same as the height of the silicon oxide film 414 of the wide field region. After the resist 409 was removed and the product was cleaned (FIG. 5b), the resultant product was processed by chemical mechanical polishing and the surface thereof was made smooth (FIG. 5c).

In the chemical mechanical polishing, the sample was polished by using a foamed polyurethane pad and ammonium-based fumed silica slurry with a polishing load of 500 g/cm$^2$ at a turntable revolution rate of 20 revolutions/minute (relative velocity: 20 m/minute) during a polishing time of 4 minutes (FIG. 1f). When the surface of the sample was made smooth by polishing, a corner 415 of the convex portion on the substrate was removed initially. In that case, since the field region 407 was protected by the silicon nitride film 409 having the small polishing rate, dishing could be avoided. Also, since the pillar 417 existed in the convex portion region 416 surrounded by the corners 415, the etching rate can be prevented from being increased. Accordingly, as shown in FIG. 5c, the surface of the sample was made smooth.

Figure 5D:
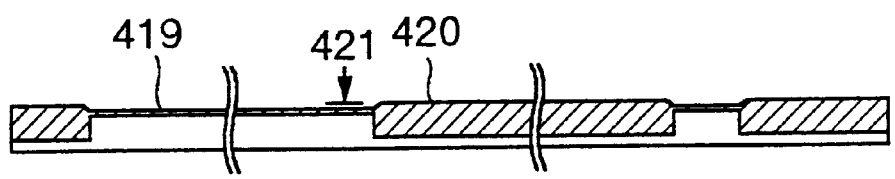

In the chemical mechanical polishing, when the polishing reached the silicon nitride film 418 on the active region, the polishing rate was lowered considerably. At that time point, the chemical mechanical polishing was stopped. Thereafter, the silicon nitride film 418 was removed from the active region, and the sample was cleaned (FIG. 5d).

According to the method shown in this inventive example, there could be formed the active region in which an interlayer insulator was buried. When the surface of the semiconductor substrate was made smooth by the conventional method, there arose the problem that the silicon substrate surface was exposed. Also, when a step difference 420 between the active region and the field region was large and the microstructure gate was formed, there arose the problem that the gate was on the step difference. According to this inventive example, it became possible to solve the above-mentioned problems.

Embodiment 3

Figure 6A:
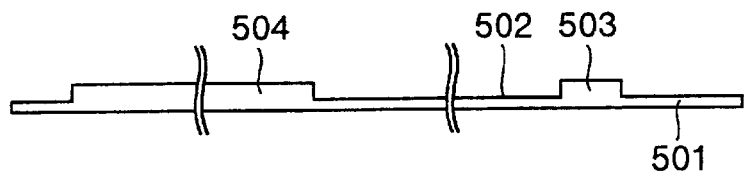
FIGS. 6a to 6f are cross-sectional views showing respective stages in a method of manufacturing semiconductor devices according to another embodiment of the present invention.
Figure 6B:
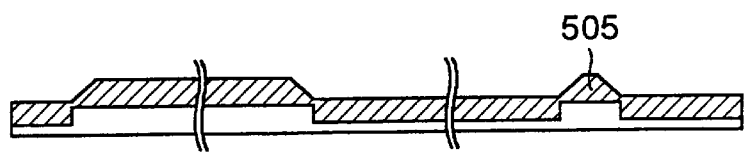
Figure 6C:
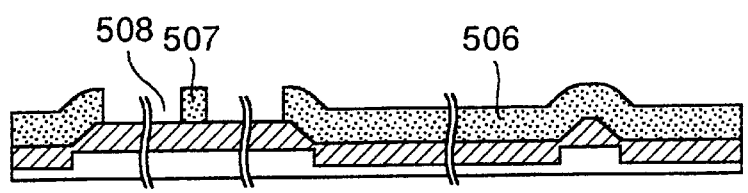

An inventive example 3 will be described with reference to FIGS. 6a to 6f. The surface of a silicon substrate 501 in which a step difference between active regions 503, 504 and a field region 502 is 0.3 micrometer was cleaned by RCA cleaning (FIG. 6a), and a silicon oxide film 505 having a film thickness of approximately 350 nm was deposited by HDP (High Density Plasma). In HDP, since the film is sputtered at the same time the film is deposited, the sample has a characteristic shape shown in FIG. 6a. Then, an opening portion 508 was formed on the wide semiconductor active region 504 by a resist 506 (FIG. 6c).

Figure 6D:
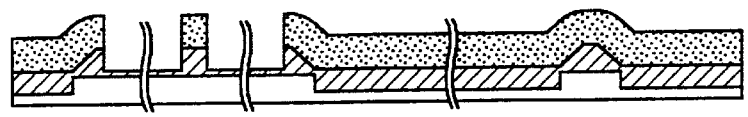
Figure 6E:
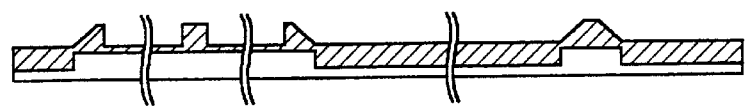
Figure 6F:
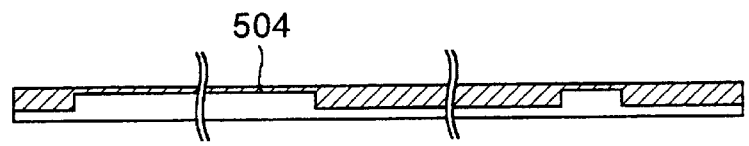

In that case, an island-like resist 507 was left so as to form a pillar. Thereafter, the silicon oxide film 505 of the resist opening portion 508 was etched by dry etching having a high selection ratio between the silicon and the silicon oxide film. At that time, etching conditions were set in such a manner that the thickness of the remaining film of the silicon oxide film became the same as the height of the surface of the silicon oxide film of the wide field (FIG. 6d). Then, the resist 506 was removed by organic cleaning (FIG. 6e), and the above-mentioned sample was processed by chemical mechanical polishing. In the chemical mechanical polishing, the sample was polished by using a foamed polyurethane pad and ammonium-based fumed silica slurry with a polishing load of 500 g/cm$^2$ at a turntable revolution rate of 20 revolutions/minute (relative velocity: 20 m/minute) during a polishing time of 6 minutes (FIG. 6f).

According to this inventive example, it became possible to make the uneven surface of the semiconductor structure 501 smooth. According to the conventional method, the semiconductor surface formed at the center portion of the sufficiently wide active region 504 was exposed due to dishing, and the semiconductor surface could not be made smooth. According to the method of the present invention, since the HDP silicon oxide film was used to bury the interlayer insulator, the shape obtained after the deposition was a special shape as shown in FIG. 6b. Therefore, the mechanical polishing amount in this inventive example was small as compared with that used when the silicon oxide film was deposited according to the conventional CVD. Thus, it became possible to make the semiconductor surface smooth within a step difference to approximately tens and several nano-meters by a combination of the conventional method and the inventive method.

Embodiment 4

Figure 7A:
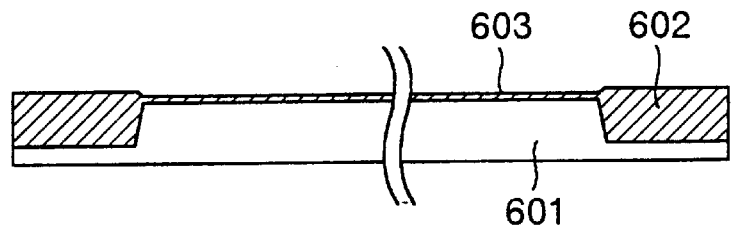
FIGS. 7a to 7d and FIGS. 8a to 8b are cross-sectional views showing respective stages in a method of manufacturing semiconductor devices according to another embodiment of the present invention.
Figure 7B:
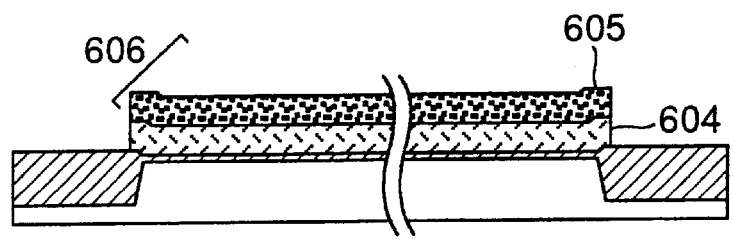

An inventive example 4 will be described with reference to FIGS. 7a to 7d and FIGS. 8a and 8b. After a silicon substrate 601 in which a buried silicon oxide film 602 was formed so as to isolate elements was cleaned by RCA cleaning, there was formed a gate oxide film 603 having a film thickness of 6 nano-meter (FIG. 7a). Thereafter, a polycrystalline silicon film 604 having a film thickness of 80 nano-meter in which phosphorous is was highly added and a tungsten film 605 having a film thickness of 80 nano-meter were deposited and a wide capacitor gate electrode 606 was formed by photolithography and dry etching (FIG. 7b). Incidentally, while the gate electrodes 605/604 are were disposed in such a manner as to overlap with the element isolation oxide film 602 from a cross-sectional standpoint, they need not be disposed in such a manner. Also, while the space between the tungsten film 605 and the polycrystalline silicon 604 needs a barrier layer for suppressing the reaction, such space is omitted in the figures.

Figure 7C:
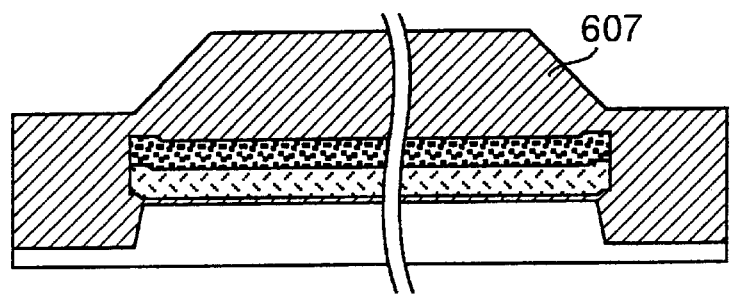
Figure 7D:
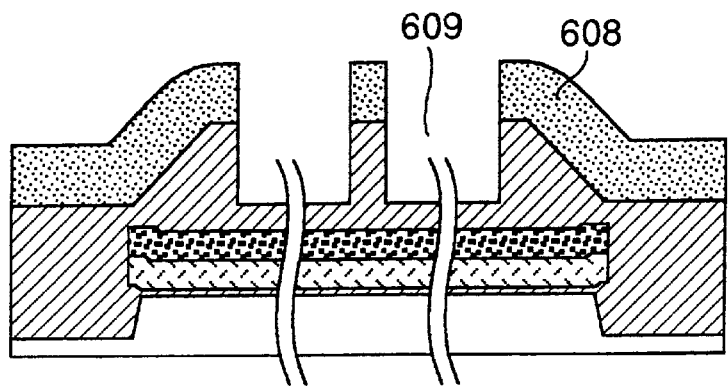
Figure 8A:
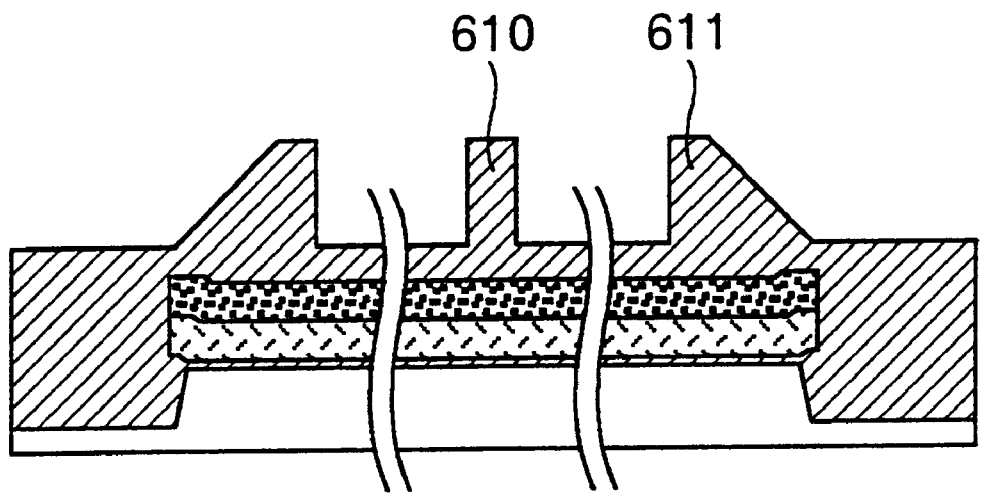
Figure 8B:
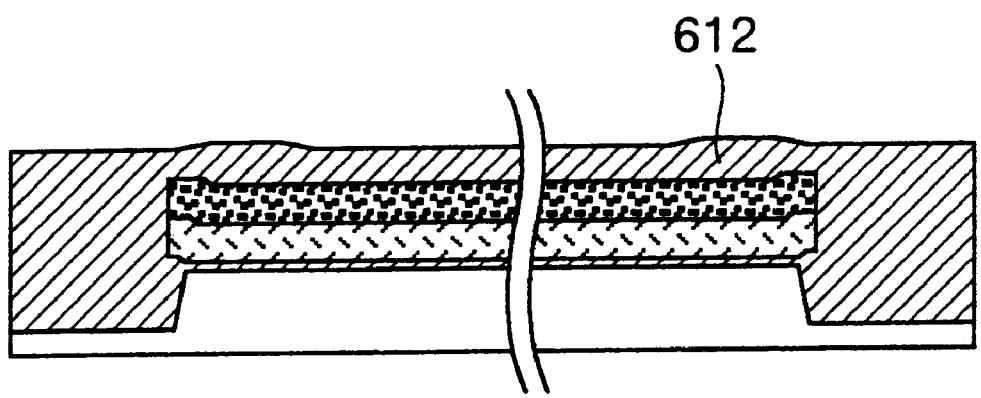

Subsequently, a silicon oxide film 607 having a film thickness of 200 nano-meter in which phorphorous was heavily added was deposited by HDP. Here, under the condition that the gate electrode is not processed by sputtering when the silicon oxide film 607 is formed by HDP, an HDP silicon oxide film 607 was deposited (FIG. 7c). Thereafter, by photolithography and dry etching, the HDP silicon oxide film was removed from the resist opening portion 609 so as to leave a pillar of the silicon oxide film on the gate electrode 606 (FIG. 7d). After the resist 608 was removed, the surface of the sample was made smooth by chemical mechanical polishing. According to the inventive method, since a pillar 610 existed in the region surrounded by corners 11 (FIG. 8a), an interlayer silicon oxide film 612 on the gate electrode 601 was not deteriorated by dishing and the gate electrode 606 could be prevented from being exposed (FIG. 8b).

According to the conventional method, although the gate electrode 606 was exposed or the surface of an interlayer silicon oxide film 612 was considerably uneven, according to this inventive example, the gate electrode 606 could be completely prevented from being exposed. Further, it became possible to control the unevenness of the silicon oxide film within a range of tens and several tens of nano-meter.

Embodiment 5

Figure 9A:
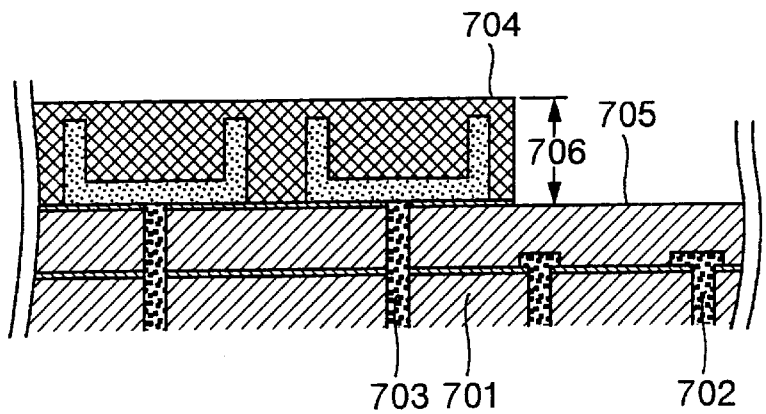
FIGS. 9a to 9c, FIGS. 10a to 10b and FIGS. 11a to 11c are cross-sectional views showing respective stages in a method of manufacturing semiconductor devices according to another embodiment of the present invention.
Figure 9B:
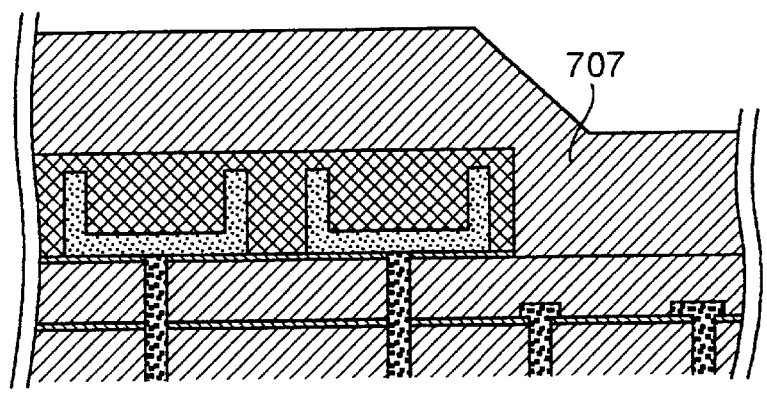
Figure 9C:
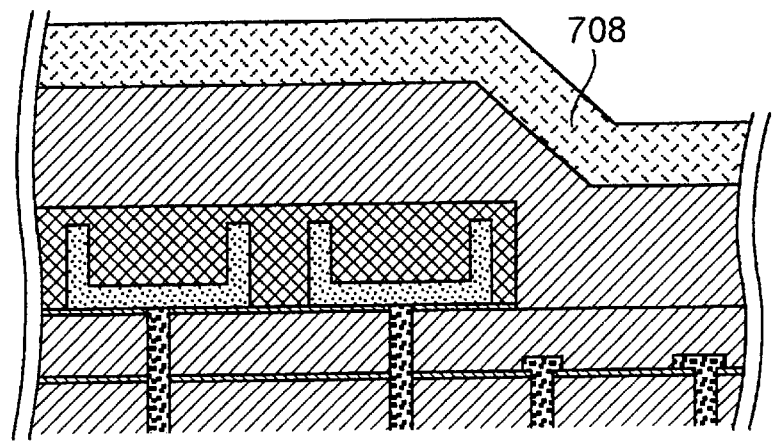

An inventive example 5 will be described with reference to FIGS. 9a to 9c and FIGS. 10, 10b and FIGS. 11a to 11c. After a highly-integrated memory transistor (not shown), an interlayer insulator 701 and interconnections 702, 703 were formed on the silicon substrate surface, a protruded capacitor structure 704 called a crown structure was formed (FIG. 9a). This pattern became the convex pattern formed on the substrate surface. Since the protruded capacitor 704 has a height 707 of approximately 1 micrometer, if upon depositing a silicon insulating film 707 which covers the protruded capacitor, a step difference 706 of approximately 1 micrometer was formed between it and a region in which no capacitor was formed (FIG. 9a). While the silicon oxide film 707 was deposited by HDP, in that case, the conditions in which the silicon oxide film 707 was deposited were set in such a manner that the capacitor structure could not be damaged or could not be etched by sputtering.

Figure 10A:
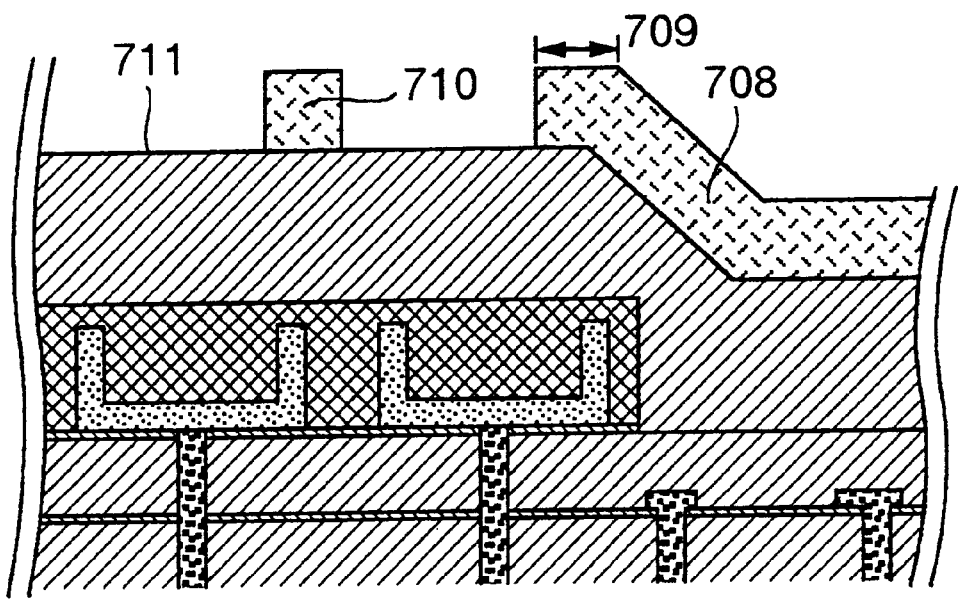
Figure 10B:
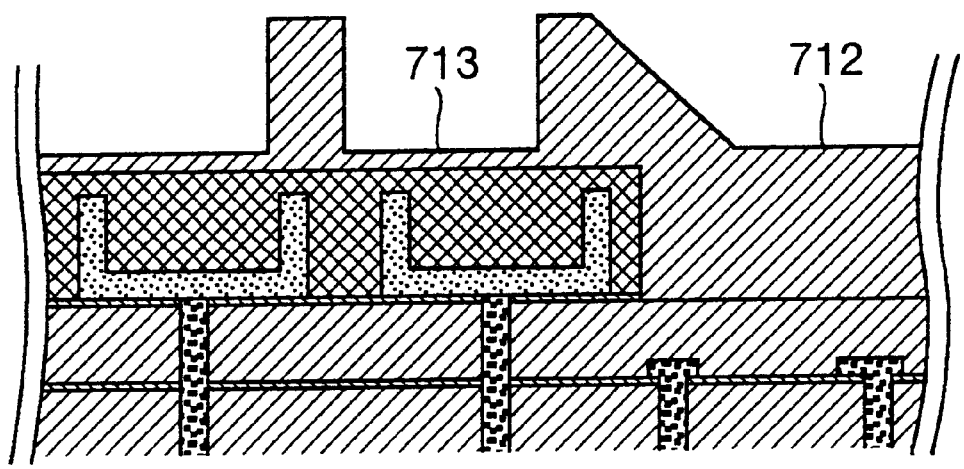

Thereafter, a resist film 708 was formed (FIG. 9c), and the resist 708 was patterned by photolithography. In that case, a resist 709 was set so as to overlap with the inside of the capacitor structure 704, and a pillar 710 was left on the portion of the capacitor structure 704 (FIG. 10a). The silicon oxide film 707 of a resist opening portion 711 was etched by dry etching (FIG. 10b). In that case, the dry etching conditions were set in such a manner that a silicon oxide film surface 712 in the region on which no capacitor structure is formed substantially agrees with an etching surface 713.

Figure 11A:
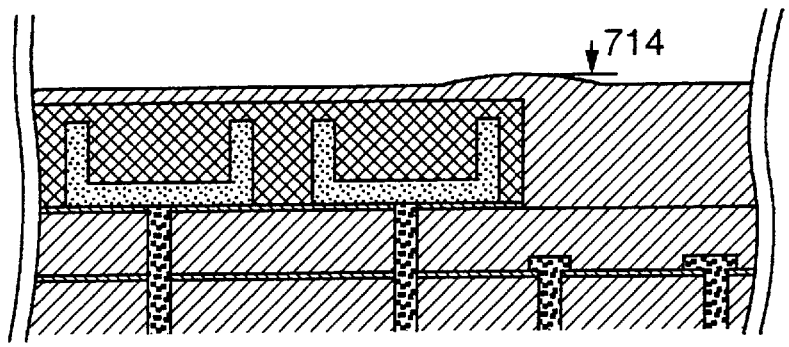
Figure 11B:
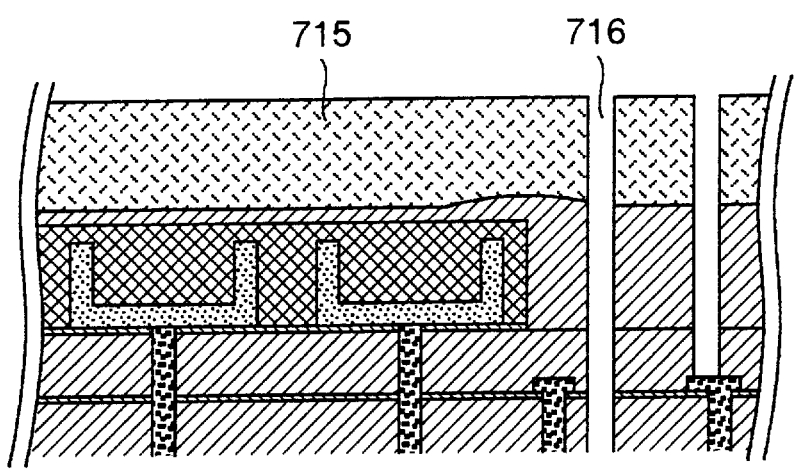

Thereafter, the above-mentioned sample was chemically mechanically polished (FIG. 11a). In the chemical mechanical polishing, the sample was polished by using a foamed polyurethane pad and ammonium-based fumed silica slurry with a polishing load of 500 g/cm$^2$ at a turntable revolution rate of 20 revolutions/minute (relative velocity: 20 m/minute) during a polishing time of 8 minutes. According to the method shown in this inventive example, it became possible to make the capacitor structure smooth by the silicon oxide film 707.

Figure 11C:
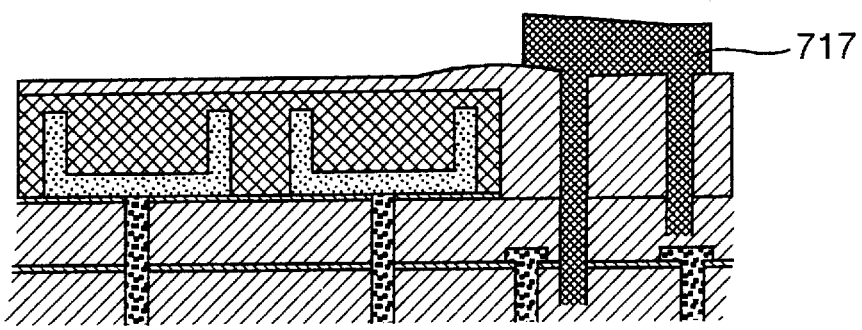

While it was difficult to form a very small resist pattern 715 by a step difference 714 left around the capacitor structure upon conventional planarization using phosphorous glass, according to the planarization method of this inventive example, since the resist pattern 715 that is much smaller than that of the conventional one was formed (FIG. 11b), it became possible to form a much small contact hole 716 and a narrow interconnection 717 (FIG. 11c).

Embodiment 6

An inventive example 6 will be described with reference to FIGS. 12a to 12e and FIGS. 13a to 13c. The surface of a silicon substrate 801 in which a step difference between active regions 803, 804 and a field region 802 is 0.35 micrometer was cleaned by RCA cleaning (FIG. 12a), and a silicon oxide film 805 having a film thickness of approximately 350 nano-meter was deposited by chemical vapor deposition (hereinafter referred to as a CVD).

Figure 12A:
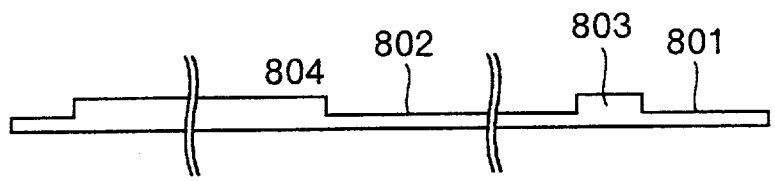
FIGS. 12a to 12e and FIGS. 13a to 13c are cross-sectional views showing respective stages in a method of manufacturing semiconductor devices according to other embodiments of the present invention.
Figure 12B:
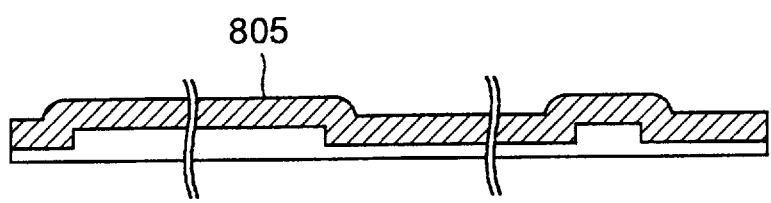
Figure 12C:
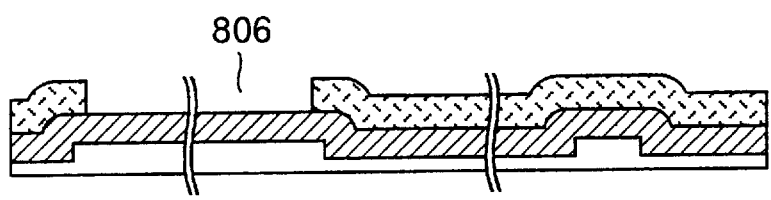
Figure 12D:
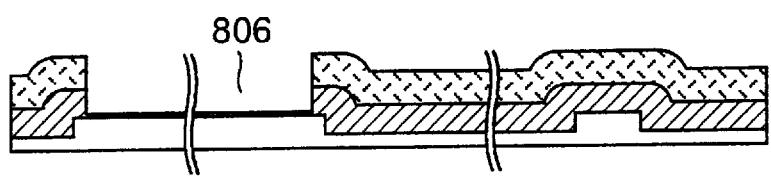
Figure 12E:
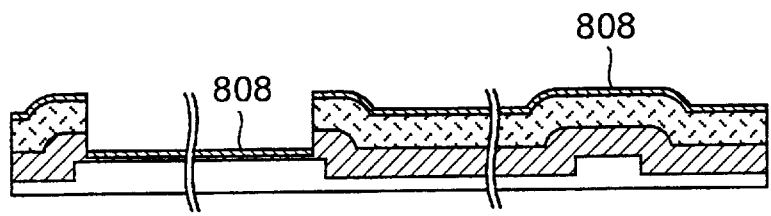
Figure 13A:
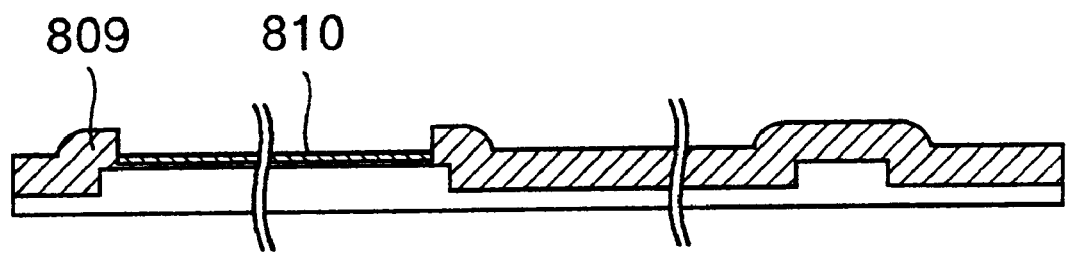

Then, an opening portion 806 was formed on the resist 805 of the wide semiconductor active region 804 (FIG. 12c). Only the silicon oxide film 805 of the resist opening portion 806 was removed by dry etching (FIG. 12d). Thereafter, a silicon nitride film 808 was deposited by sputtering (FIG. 12e). Under this condition, when the silicon nitride film 808 was deposited, the silicon nitride film 808 within the opening portion 806 and the silicon nitride film 808 on the wide field 802 and the narrow active region 803 were isolated from each other. Thereafter, by removing the resist 805, the silicon nitride film 808 on the resist 805 also was removed simultaneously (FIG. 13a).

Figure 13B:
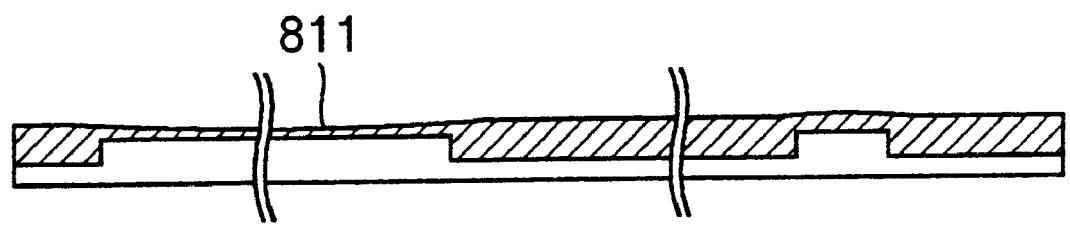
Figure 13C:
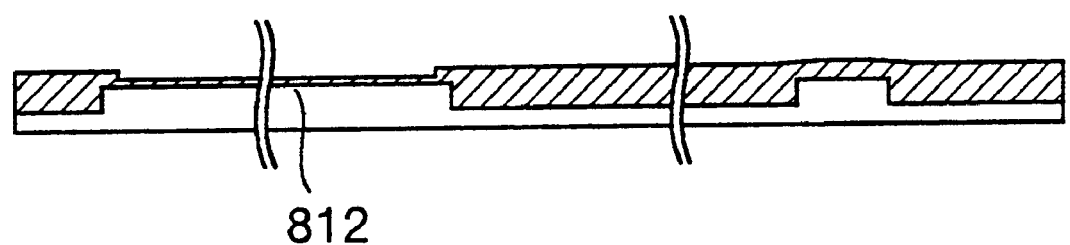

This sample was chemically mechanically polished (FIG. 13b). In the chemical mechanical polishing, the sample was polished by using a foamed polyurethane pad and ammonium-based fumed silica slurry with a polishing load of 500 g/cm$^2$ at a turntable revolution rate of 20 revolutions/ minute (relative velocity: 20 m/minute) during a polishing time of 4 minutes. In that case, although slurries were collected in a region 810 surrounded by the corners 809 so that the polishing rate increased, the polishing rate of the silicon nitride film 808 was approximately ¼ that of the silicon oxide film 805. Thus, it could be confirmed that dishing was not caused in the region 810 surrounded by the corners 809. When the polishing surface reached the silicon nitride film 808 on the wide field 804 by chemical mechanical polishing, the rotation torque of the polishing apparatus increased so that chemical mechanical polishing was stopped. Thereafter, a silicon nitride film 811 on the wide field 804 was removed and made smooth (FIG. 13c).

According to this inventive example, it became possible to make the uneven surface of the semiconductor structure 801 smooth. Although the element characteristic was deteriorated by depression of the silicon oxide film at the end portions of the active regions 803, 804 according to the conventional method, with this inventive example, it became possible to completely suppress the depression of this silicon oxide film. Also, it became possible to suppress the semiconductor surface 812 from being exposed due to dishing caused on the wide active region 804.

Embodiment 7

An inventive example of a DRAM manufacturing method according to this invention will be described with reference to FIGS. 14a to 14e, FIGS. 15a and 15b, FIGS. 16a to 16c, FIGS. 17a to 17d, FIGS. 18a to 18c, FIGS. 19a to 19c, FIGS. 20a to 20d, FIGS. 21a to 21c, FIGS. 22a to 22c, FIGS. 23a and 23b, FIGS. 24a to 24d and FIG. 25.

Figure 14A:
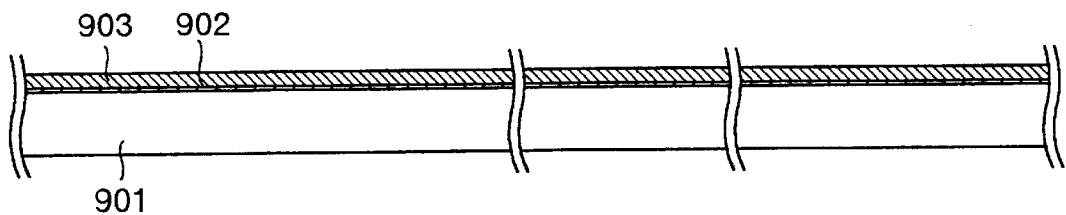
FIGS. 14a to 14e, FIGS. 15a and 15b, FIGS. 16a to 16c, FIGS. 17a to 17d, FIGS. 18a to 18c, FIGS. 19a to 19c, FIGS. 20a to 20d, FIGS. 21a to 21c, FIGS. 22a to 22c, FIGS. 23a and 23b, FIGS. 24a to 24d and FIG. 25 are diagrams showing respective stages in a method of manufacturing semiconductor devices according to another embodiment of the present invention.

Initially, as shown in FIG. 14a, after a silicon substrate 901 was cleaned, there was formed a silicon oxide film 902 for protecting the surface of the silicon substrate 901 by thermal oxidization. Further, a silicon nitride film 903 was deposited on the silicon oxide film 902 by CVD. This silicon nitride film 903 serves as a polishing stopper film for suppressing an excess polishing in the later chemical mechanical polishing.

Figure 14B:
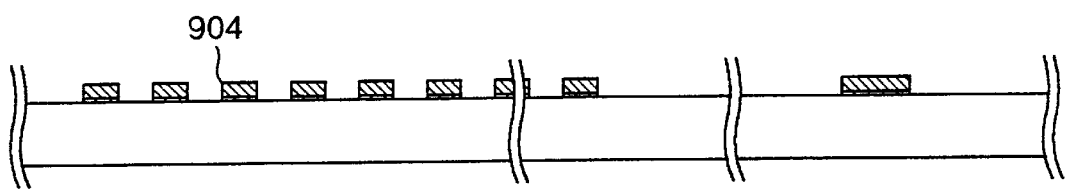
Figure 14C:
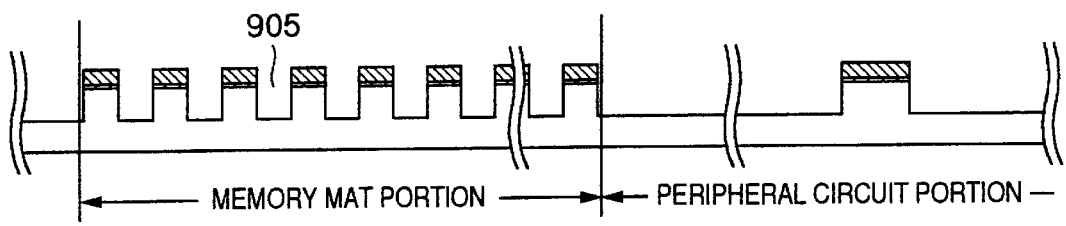

Next, the laminated film of the silicon oxide film 902 and the silicon nitride film 903 was patterned by photolithography and dry etching (FIG. 14b). The laminated film 904 thus patterned was used as a hard mask, and a groove structure was formed by dry-etching the silicon substrate (FIG. 14c). The left-hand side of FIG. 14c shows the cross-sectional structure of the memory mat portion of a DRAM (Dynamic Random Access Memory), and the right-hand side thereof show the cross-sectional structure of the peripheral circuit portion, respectively. The concave portion of the silicon substrate 901 was later filled with an insulating material to become the field region for isolating elements, and the convex portion of the silicon substrate 901 became the active region in which elements would be formed later on. As shown in FIG. 14c, the active region and the field region were densely formed in the memory mat portion as compared with the peripheral circuit portion.

Figure 14D:
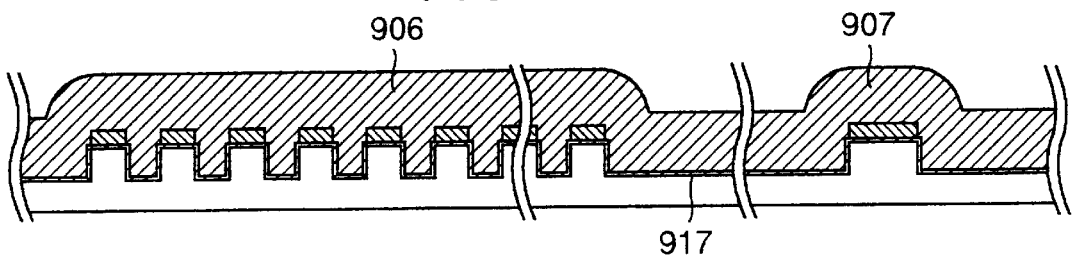

Then, after the silicon substrate 901 was cleaned, a thermal oxide film (silicon oxide film) 917 was formed on the inner surface of the groove structure by thermal oxidization. Further, insulating films (silicon oxide films) 906, 907 were deposited by CVD using well-known $O_3$—TEOS (FIG. 14d). Since the opening portion of the groove structure became small in the memory mat portion in which the uneven patterns of the active region and the field region were formed densely (spacing between adjacent active regions is reduced), as shown in FIG. 14d, the insulating film 906 whose upper surface was substantially the same height was formed over the whole surface of the memory mat portion.

The film thickness of the silicon nitride film 903 serving as the deposited polishing stopper in FIG. 14a should preferably be made thicker from a standpoint of increasing a process margin used in the later chemical mechanical polishing. However, when the film thickness of the silicon nitride film 903 is increased, the aspect ratio of the groove structure 905 increases. As a result, when the insulating film 906 is deposited in FIG. 14d, the groove structure 905 cannot be completely filled with the insulating film 906 so that the element isolation characteristic of the field region becomes insufficient. Therefore, the silicon nitride film 903 cannot be made too thick.

Figure 14E:
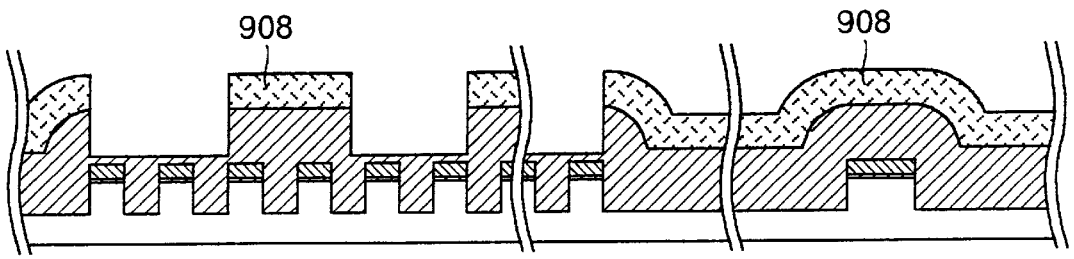
Figure 15A:
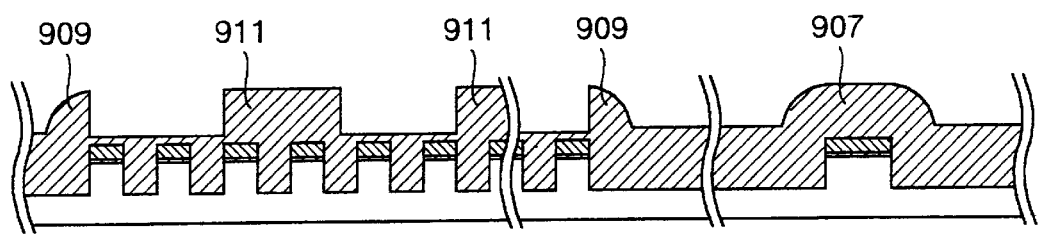
Figure 15B:
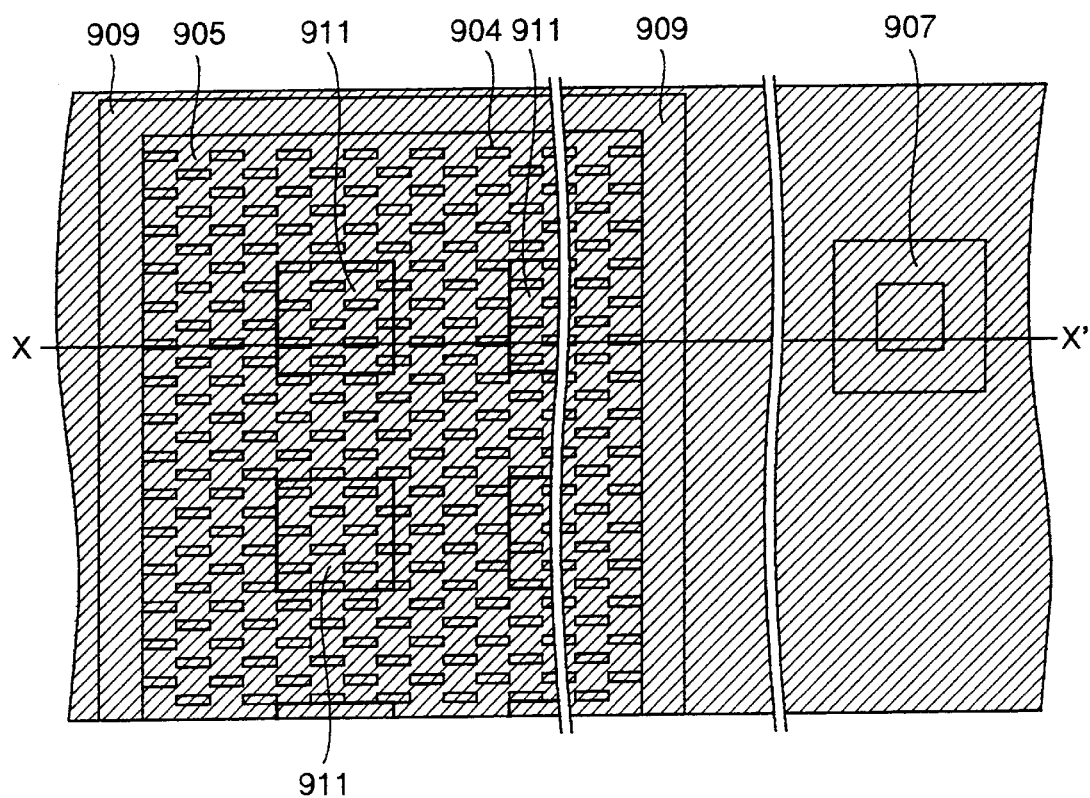

Next, in order to reduce the polishing amount required in the later chemical mechanical polishing, a part of the insulating film 906 which became the convex shape on the memory mat portion was removed by photolithography/dry etching (FIG. 14e). Further, when a resist 908 was removed, there was presented a cross-sectional view shown in FIG. 15a. FIG. 15b is a plan view of FIG. 15a, and the cross-sectional structure shown by X—X' in FIG. 15b corresponds to FIG. 15a.

A first feature of the inventive example 7 lies in that the insulating film 906 on the memory mat portion is not removed from the whole area of the memory mat portion but a part of the insulating film is removed and the insulating film 906 is left partly. In the inventive example 7, the portion of this remaining insulating film is referred to as a pillar 911. In other words, it is important to form the pillar 911 of the insulating film on the memory mat portion.

The shape of this pillar 911 is optimized to be a dot-like shape or a line-like shape in accordance with the polishing amount and the polishing target material of the chemical mechanical polishing of the insulating film, shapes of the active region and the field region of the memory mat portion and the size of the memory mat portion. Also, regardless of the pattern of the groove structure 905 of the lower layer, plural pillars 911 may be disposed in regular repetitive pattern. Further, the shape, size and location of the pillar 911 are determined in such a manner that the volume of the insulating film that should be polished by chemical mechanical polishing in the peripheral circuit portion other than the memory mat portion becomes substantially equal to a result which results from adding the volume of the pillar 911 to the volume of the corner 908 in the outer peripheral portion of the memory mat portion. Thus, the polishing amounts required in the chemical mechanical polishing become uniform on the whole.

Figure 24A:
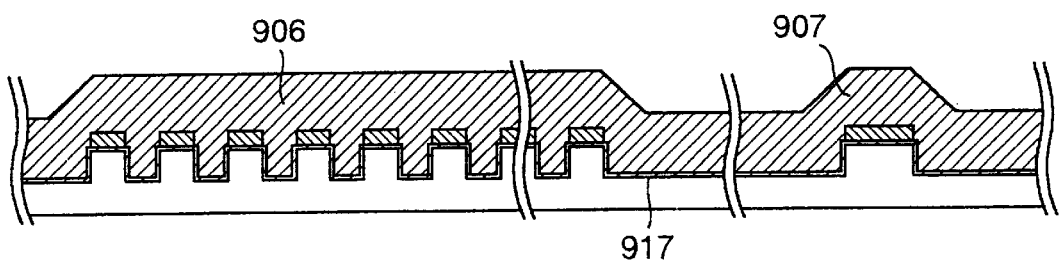
Figure 24B:
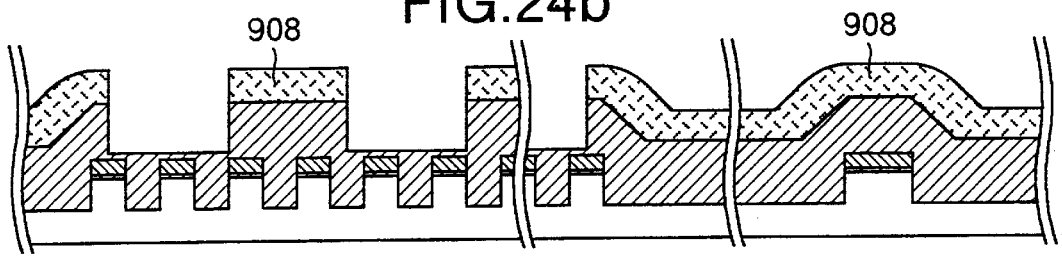
Figure 24C:
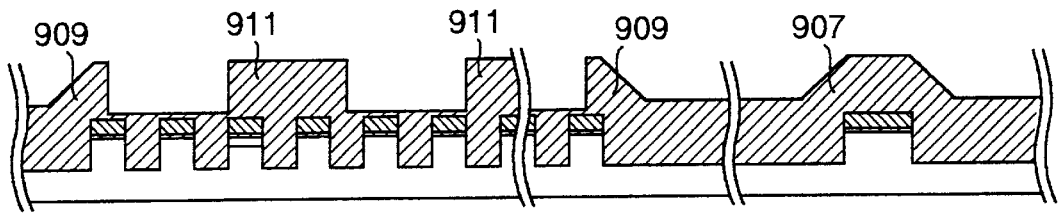
Figure 24D:
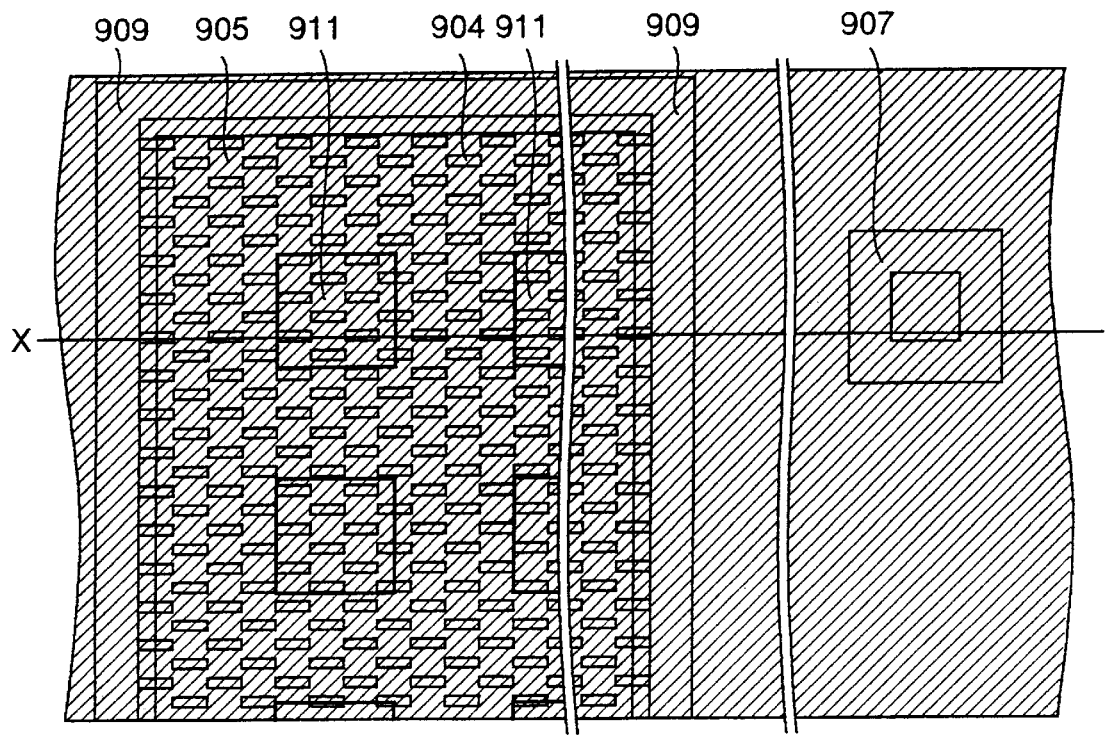

FIGS. 14d, 14e, 15a, 15b show an example in which insulating films 906, 907 are deposited by CVD using $O_3$—TEOS. FIGS. 24a to 24d show an example in which the insulating films 906, 907 are deposited by HDP (High Density Plasma). In this case, as shown in FIGS. 24b to 24d, when the insulating films 906, 907 are partly removed from the memory mat portion, the inner periphery of the corner 909 comes closer to the inside as compared with the outer periphery of the memory mat portion in such a manner that the height of the corner 909 of the insulating film becomes coincident with that of the pillar 908. The shape of the pillar 911 and the like are similar to those of the case in which $O_3$—TEOS was used. Incidentally, the cross-sectional structure shown by X—X' in FIG. 24b corresponds to FIG. 15a.

Figure 16A:
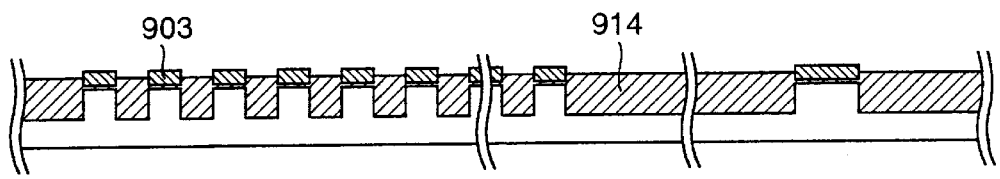

This sample was chemically mechanically polished (FIG. 16a). A second feature of the inventive example 7 lies in that the insulating films 906, 907 on the active region are removed by chemical mechanical polishing until the silicon nitride film 903 serving as the polishing stopper on the active region is exposed. In the chemical mechanical polishing, the sample was polished by using a foamed polyurethane pad and ammonium-based fumed silica slurry with a polishing load of 500 g/cm$^2$ at a turntable revolution rate of 20 revolutions/minute (relative velocity: 20 m/minute) during a polishing time of 4 minutes.

In the initial stage of the chemical mechanical polishing, the corner 909 of the insulating film surrounding the outer periphery of the memory mat portion and the pillar 911 of the insulating film which is substantially the same in height as the corner 909 of this insulating film were polished initially. Since the load of the chemical mechanical polishing concentrated in the corner 909 of the insulating film in the prior art was dispersed into the pillar 911, the bending of the corner 909 of the insulating film could be considerably suppressed. Thus, the amount in which scratches were produced could be suppressed considerably, and the fraction defective could be lowered considerably.

The sample was further polished, the end of the polishing was detected in the silicon nitride film 903 serving as the polishing stopper, and the chemical mechanical polishing was ended.

When the pillar 911 was not formed (like the prior art), the polishing rates are different at the portion near the center of the memory mat portion and the portion near the outer periphery so that the polishing rate of the portion near the center of the memory mat portion becomes large as compared with the polishing rate of the portion near the outer periphery. When the sample is chemically mechanically polished until the silicon nitride film 903 serving as the polishing stopper is exposed under the condition that the pillar 911 is not formed, the film thickness of the silicon nitride film 903 serving as the polishing stopper cannot be increased as mentioned before. Therefore, if the sample is polished until the silicon nitride film 903 on the active region near the outer periphery is exposed, then the silicon nitride film 903 and the silicon oxide film 902 are both polished in the active region near the center and the silicon substrate 901 is exposed. Also, if the polishing is stopped at the time point in which the silicon nitride film 903 on the active region near the center is exposed in order to prevent the silicon substrate 901 from being exposed, then the silicon nitride film 903 near the outer periphery cannot be exposed and the element cannot be formed in the active region near the outer periphery in the later process.

Figure 16B:
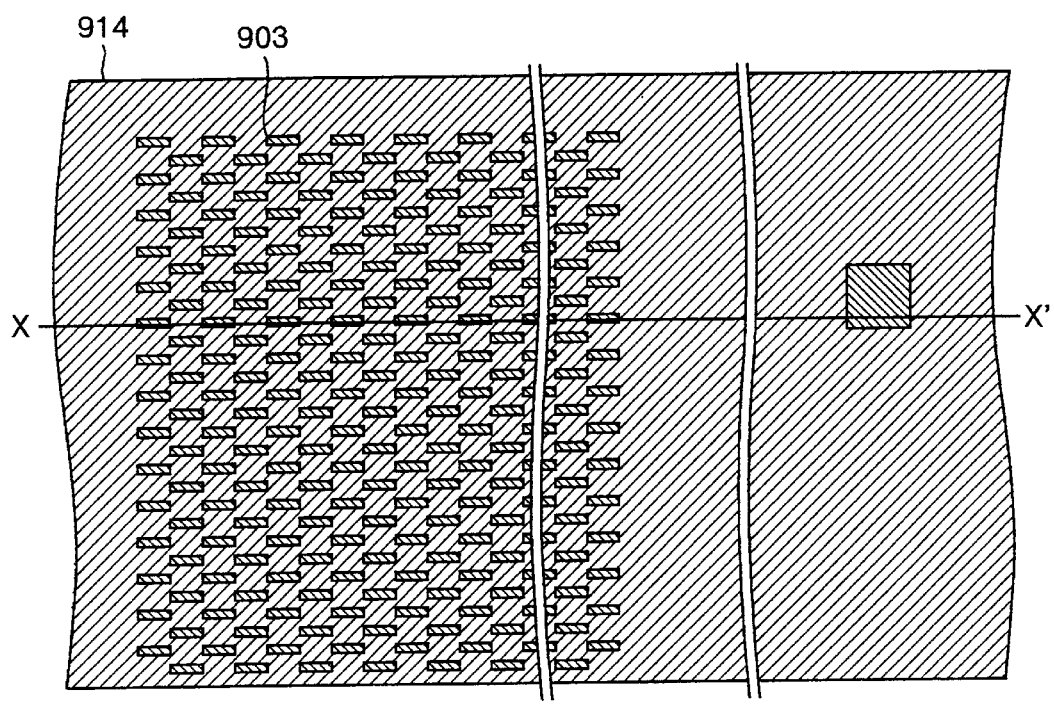

When the insulating films 906, 907 on the active region are chemically mechanically polished until the silicon nitride film 903 on the active region is exposed (the above-mentioned second feature) like the inventive example 7, if the pillar 911 of the insulating film is formed on the memory mat portion, then the fluctuation of the polishing rate can be suppressed over the whole region of the memory mat portion. Thus, it becomes possible to execute uniform chemical mechanical polishing. FIG. 16b is a plan view of FIG. 16a, and the cross-sectional structure shown by X—X' in FIG. 16b is FIG. 16a. From the above, at the timing point in which the chemical mechanical polishing is ended, according to the inventive example 7, the silicon nitride film is exposed on the whole active region of the memory mat portion as shown in FIG. 16b.

Incidentally, in FIG. 16a, since the polishing rate of the element isolation insulating film 914 buried in the groove structure 905 is larger than that of the silicon nitride film 903, the surface of the element isolation insulating film 914 is lower than the surface of the silicon nitride film 903.

Figure 16C:
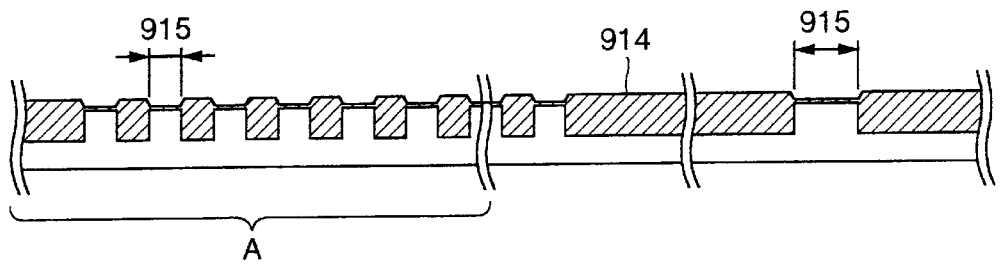

Thereafter, only the silicon nitride film 903 was removed, and a shallow groove element isolation structure was formed in the field region (FIG. 16c). The surface of the element isolation insulating film 914 is consistantly made higher than that of the active region 915. If the surface of the element isolation insulating film 914 is lowered at the end portion of the active region 915, then this affects electrical characteristics of an element which will be formed on the active region later on. According to the inventive example 7, such problem can be solved completely.

Figure 17A:
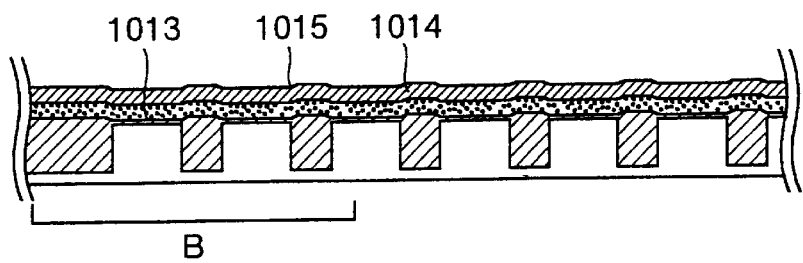

Then, as shown in FIG. 17a, the silicon oxide film 902 of the active region was removed by cleaning and a gate insulating film 1013 made of a silicon oxide film was formed by thermal oxidation. Then, a polycrystalline silicon 1014 and a silicon nitride film 1015 were deposited by CVD. Incidentally, FIG. 17a shows a portion A of FIG. 16a in an enlarged-scale.

Thereafter, a gate electrode 1014 was formed by patterning a laminated film of the polycrystalline silicon 1014 and the silicon nitride film 1015 according to lithography and dry etching. Incidentally, the gate electrode 1014 should preferably be made low in resistance value. In this case, in FIG. 17a, a metal silicide film or metal film might be formed between the polycrystalline silicon 1014 and the silicon nitride film 1015, and the gate electrode 1014 might be formed of a laminated film of the polycrystalline silicon and the metal silicide or a laminated film of the polycrystalline silicon and the metal. When the gate electrode is small in size, there is used photolithography using a KrF or ArF laser beam or electron beam lithography.

Figure 17B:
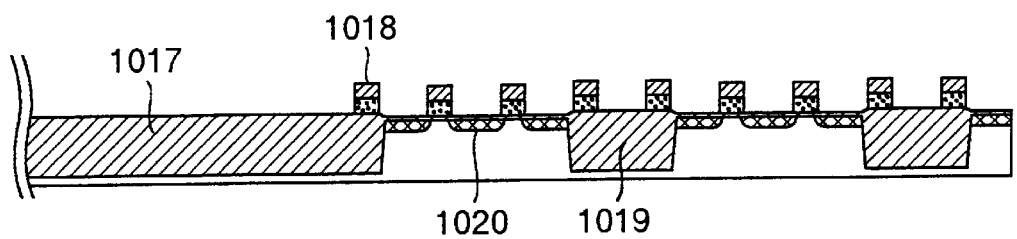
Figure 17C:
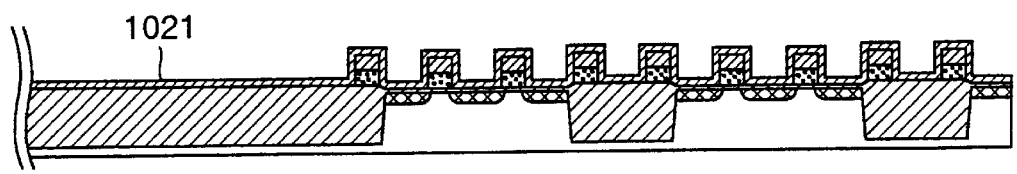

Thereafter, as shown in FIG. 17b, a patterned laminated film 1018 was used as a mask and a source-drain region 1020 was formed by adding impurities. Reference numerals 1017, 1019 denote shallow element isolation structures of the field region. Incidentally, FIG. 17b shows a portion B in FIG. 17a in an enlarged-scale. Further, as shown in FIG. 17c, a silicon nitride film 1021 was formed on the whole of the sample by CVD. By removing the silicon nitride film 1021 with anisotropy etching, the silicon nitride film 1021 was left only in the side wall of the laminated film 1018 and a side wall film 1022 was formed (FIG. 17d).

Figure 17D:
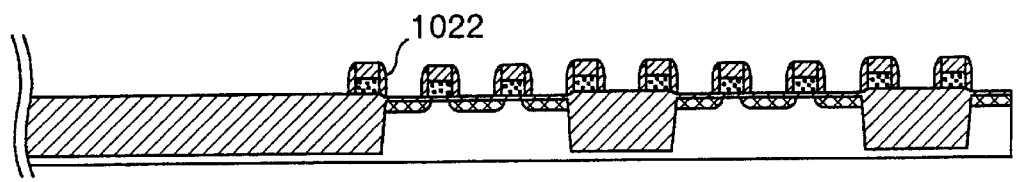
Figure 18A:
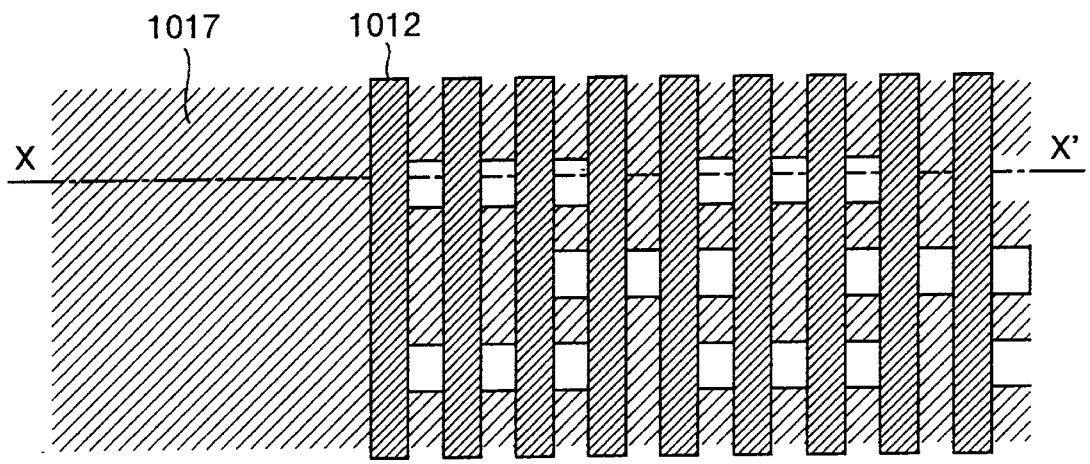

FIG. 18a is a plan view of FIG. 17d. A cross-sectional structure shown by X—X' in FIG. 18a corresponds to FIG. 17d. In FIG. 18a, reference numeral 1017 denotes a silicon oxide film which is the element isolation insulating film in the field region, and reference numeral 1012 denotes a gate electrode whose upper surface and side surface are covered with silicon nitride films 1021, 1015.

Figure 18B:
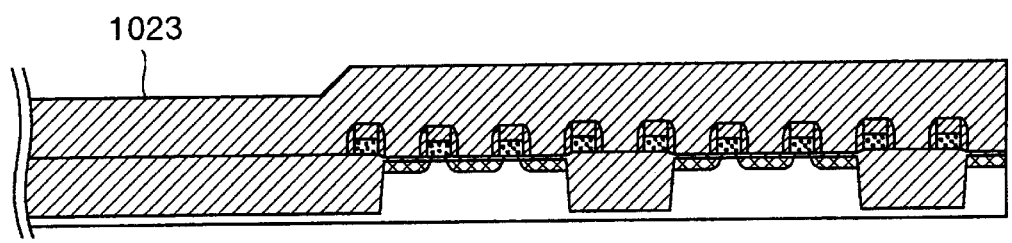

Thereafter, a silicon oxide film 1023 was deposited so as to fill the space between the gate electrodes 12 by HDP (High Density Plasma). Incidentally, this deposition is not limited to HDP but may be CVD when a heat history or the like is not taken into consideration. Since the gate electrodes 1012 were densely formed in the memory mat portion as compared with the peripheral circuit, as shown in FIG. 18b, the silicon oxide film 1023 was deposited over the whole surface of the memory mat portion in such a manner that its upper surface becomes substantially the same height.

Figure 18C:
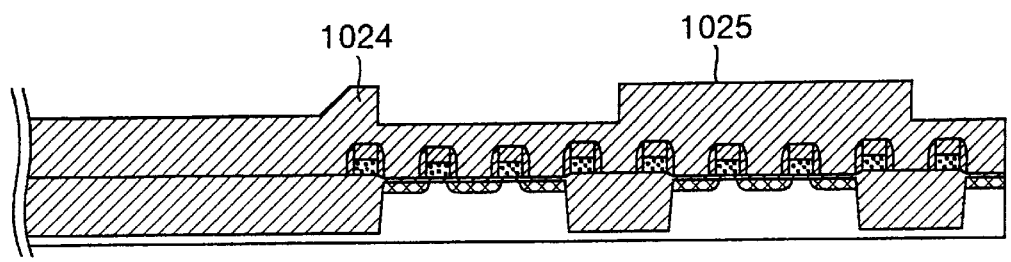

Thereafter, by photolithography/dry etching, as shown in FIG. 18c, a part of the silicon oxide film 1023 of the convex region was removed from the memory mat portion. Similarly to FIG. 15a, also in this case, not all of the silicon oxide films 1023 was removed from the memory mat portion, but pillars 1025 were left.

This pillar 1025 was formed across a plurality of gate electrodes 1012, and their shapes were optimized by the polishing amount of the chemical mechanical polishing. Also, the layout of the pillars 1025 were a regular repetitive pattern. Further, the layout of the pillars 1025 was determined in such a manner that the volume of the silicon oxide film that should polished in the chemical mechanical polishing and the result which results from adding the volume of the pillars 1025 to the calculated volume of the corner 1024 at the outer periphery of the memory mat portion became equal to each other (FIG. 18c).

Figure 19A:
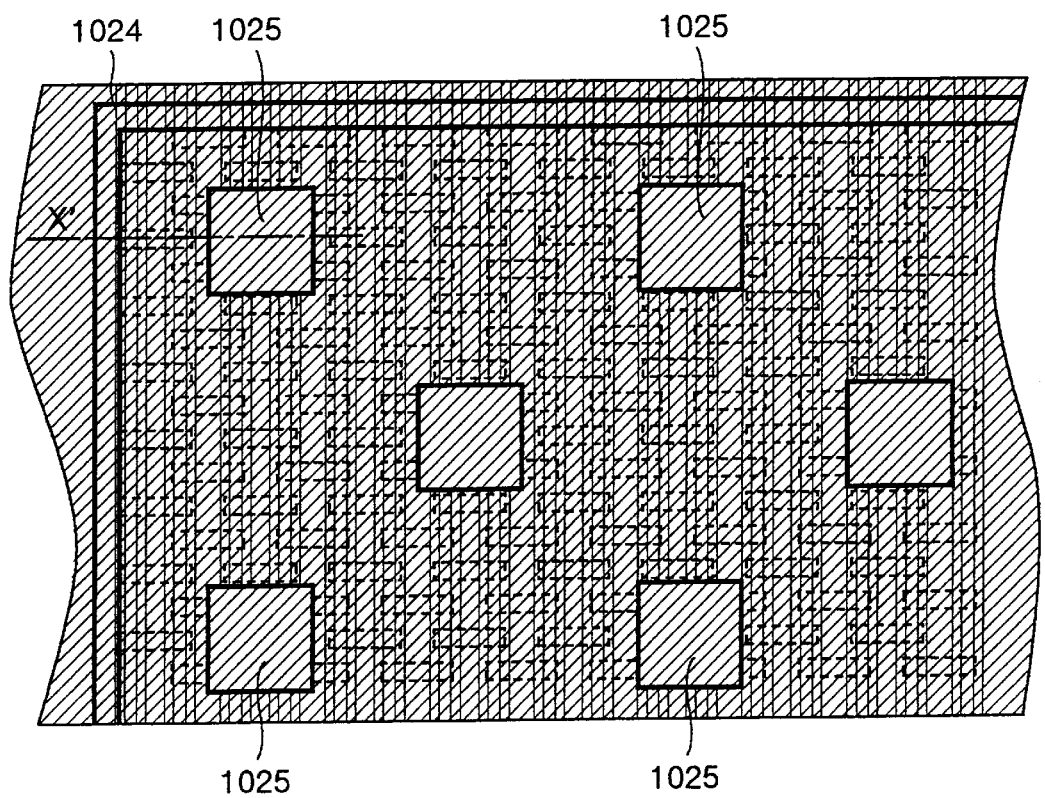

FIG. 19a is a plan view in which each pillar 1025 was formed by partly etching the interlayer insulator 1023 on the memory mat portion. A cross-sectional structure shown by X—X' in FIG. 19a corresponds to FIG. 18c.

Figure 19B:
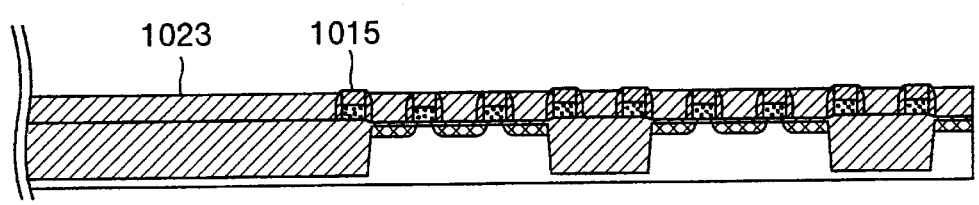

This sample was chemically mechanically polished (FIG. 19b). In the chemical mechanical polishing, the sample was polished by using a foamed polyurethane pad and ammonium-based fumed silica slurry with a polishing load of 700 g/cm$^2$ at a turntable revolution rate of 20 revolutions/ minute (relative velocity: 20 m/minute) during a polishing time of 7 minutes.

In the initial stage of the chemical mechanical polishing, a corner 1024 and a pillar 1025 of the same height as the corner were polished initially. In the conventional process in which the pillar 1025 of the insulating film was not formed, a large amount of scratches were produced. However, in the inventive example 7, since the load of the chemical mechanical polishing concentrated in the corner 1024 was dispersed into the pillar 1025, the amount in which scratches were produced could be suppressed considerably.

The sample was further polished, the end of the polishing was detected in the silicon nitride film 1015 serving as the polishing stopper, and the chemical mechanical polishing was ended.

Considering the process margin of the chemical mechanical polishing, the film thickness of the silicon nitride film 1015 should preferably be made thick. In this case, the silicon oxide film 1023 was insufficiently put into the space between the adjacent gate electrodes 1012 so that the film thickness of the silicon nitride film 1015 could not be increased. When the sample was chemically mechanically polished under such situation, like the prior art in which the pillar 1025 was not formed, the polishing rate increased at the portion near the center of the memory mat portion so that the gate electrode 1014 was exposed. According to this inventive example 7, such problem could be solved completely.

Incidentally, in FIG. 19b, since the polishing rate of the silicon oxide film 1023 was larger than that of the silicon nitride film 1015, the surface of the silicon oxide film 1023 was lower than the surface of the silicon nitride film 1015.

Figure 19C:
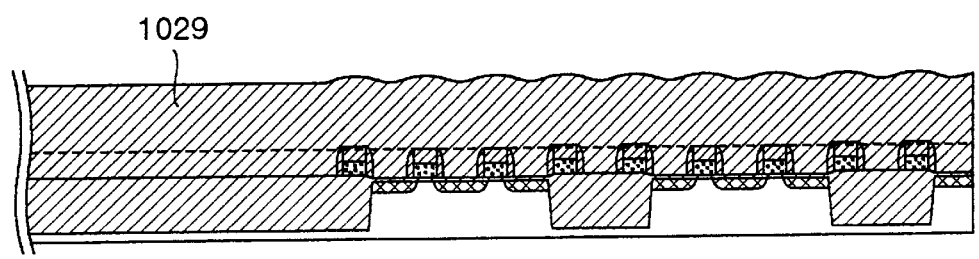

Thereafter, a silicon oxide film 1029 was deposited by CVD (FIG. 19c). Since a large step difference could be prevented from being produced by the use of the pillar 1025, large concavities and convexities could be prevented from being produced on the surface of the deposited silicon oxide film 1029. Therefore, in the following photolithography process, there arises no trouble.

Figure 20A:
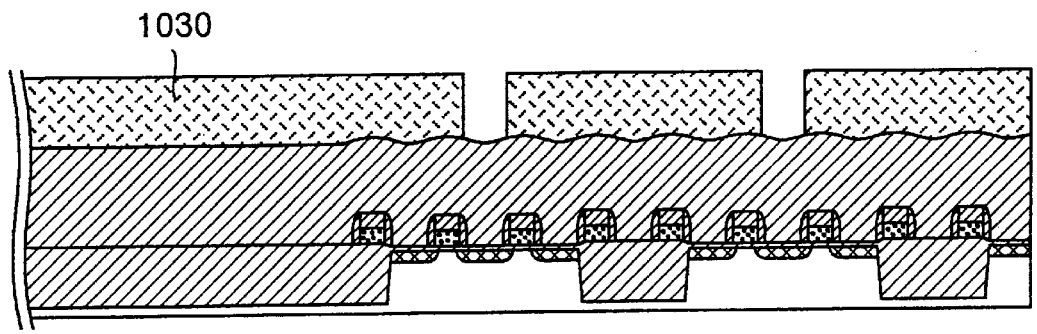
Figure 20B:
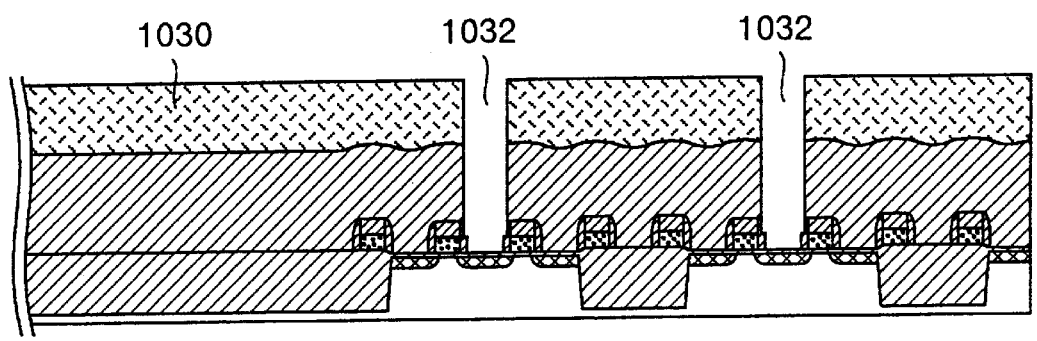
Figure 20C:
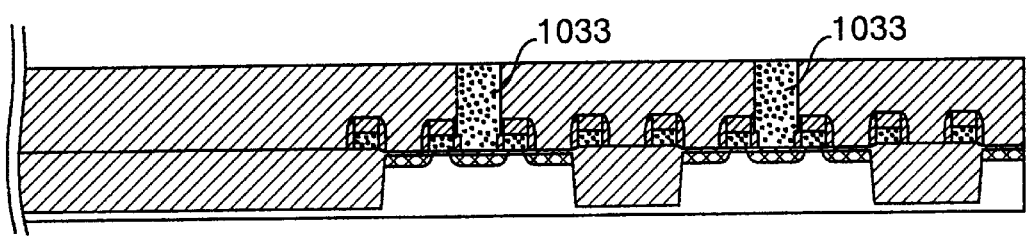
Figure 20D:
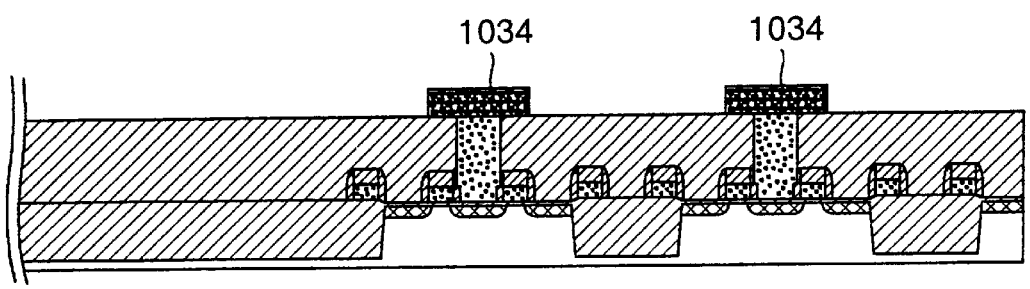

Thereafter, as shown in FIGS. 20a and 20b, a pattern of a resist 1030 was used as a mask and a contact hole 1032 was formed by photolithography/dry etching. Further, after the resist 1030 was removed, a polycrystalline silicon in which impurities were heavily doped was deposited so as to fill the contact hole 1032 by CVD, and a plug 1033 was formed by chemically mechanically polishing the sample (FIG. 20c). Thereafter, there was formed a metal interconnection 1034 as a data line (FIG. 20d).

Figure 21A:
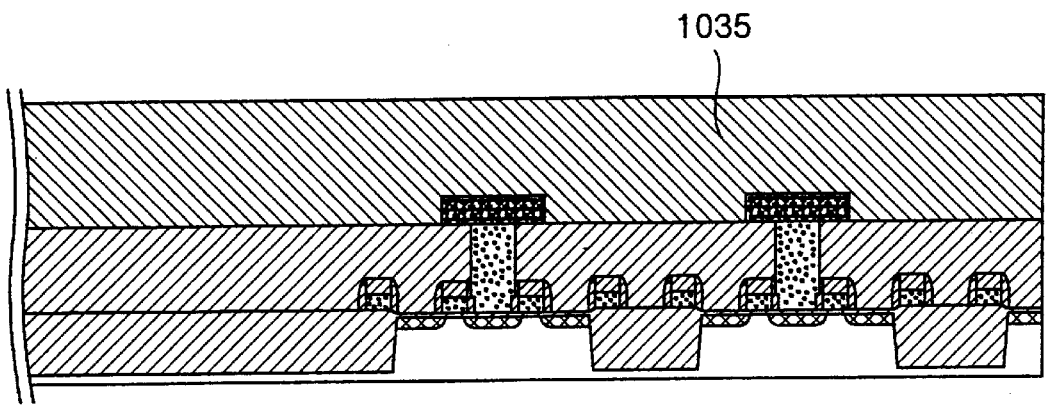
Figure 21B:
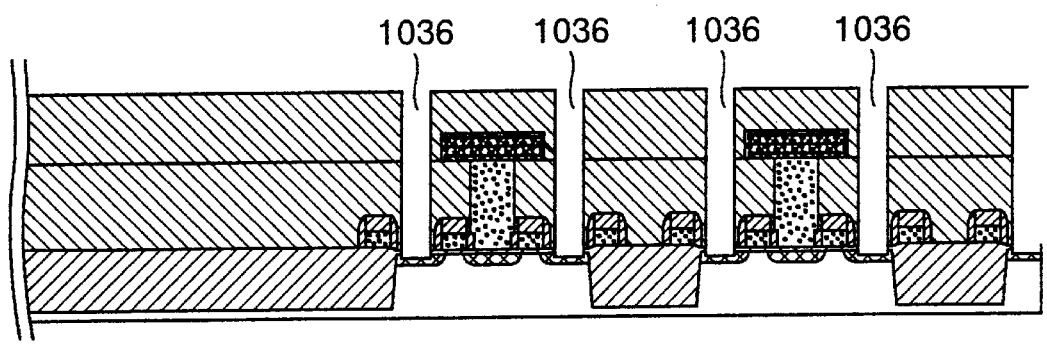
Figure 21C:
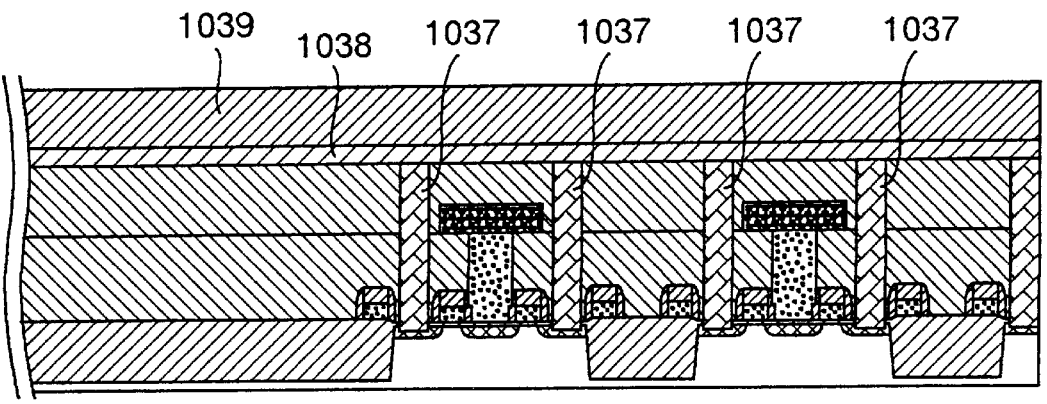

Subsequently, as shown in FIG. 21a, a silicon oxide film 1035 containing boric acid and phosphorous was deposited and heat-treated at high temperature, thereby resulting in the surface being made smooth. In this case, the silicon oxide film 1035 could be deposited by well-known CVD and the surface could be made smooth by chemical mechanical polishing. Then, a through-hole 1036 was formed by photolithography/dry etching (FIG. 21b). Further, a polycrystalline silicon film in which impurities were heavily doped was deposited so as to fill the through-hole 1036, and a plug 1037 was formed by making the surface smooth by chemical mechanical polishing. Thereafter, a polycrystalline silicon film 1038 in which impurities were heavily doped and a silicon oxide film 1039 were deposited continuously (FIG. 21c).

Figure 22A:
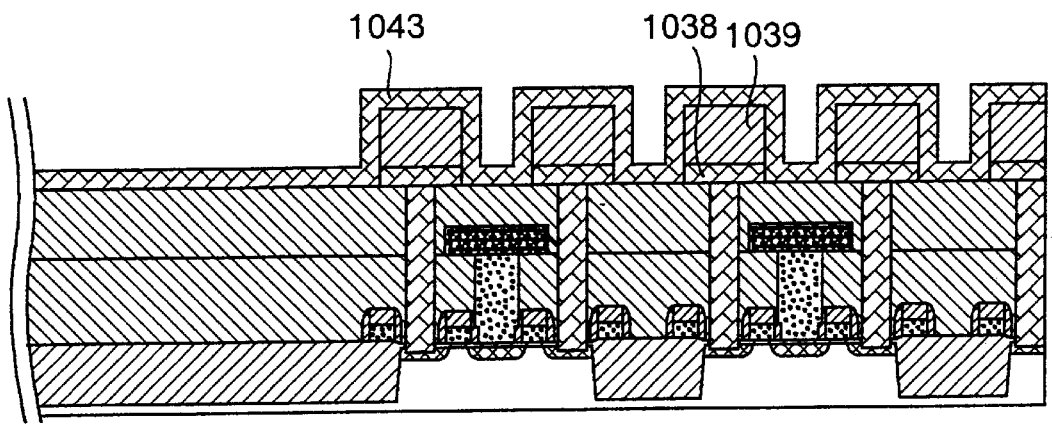
Figure 22B:
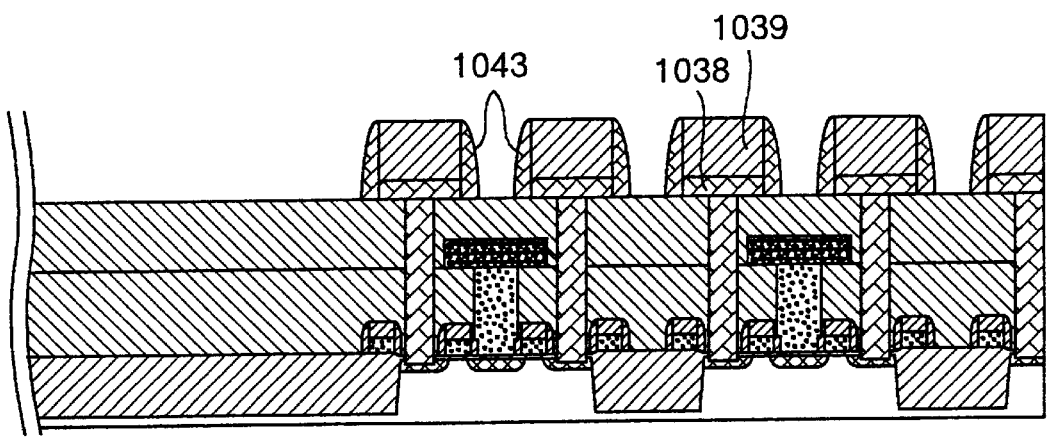
Figure 22C:
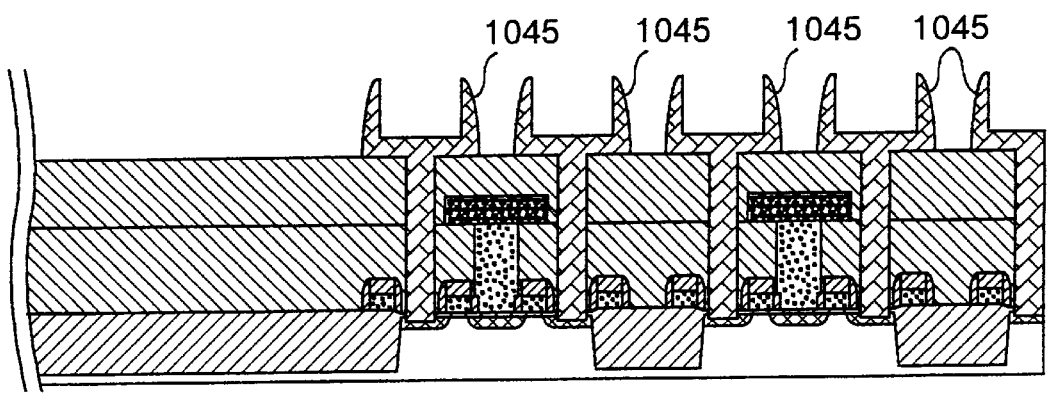

After the laminated film comprising the polycrystalline silicon film 1038 and the silicon oxide film 1038 was patterned in accordance with the plan shape of the capacitor, a polycrystalline silicon 1043 in which impurities were heavily doped was deposited (FIG. 22a). Then, the polycrystalline silicon 1043 was left on the side wall of the patterned laminated film by anisotropy etching. Further, by removing the above-mentioned silicon oxide film 1039, there was formed a crown-like lower electrode 1045 comprising the polycrystalline silicon films 1038, 1043 (FIG. 22c).

Figure 23A:
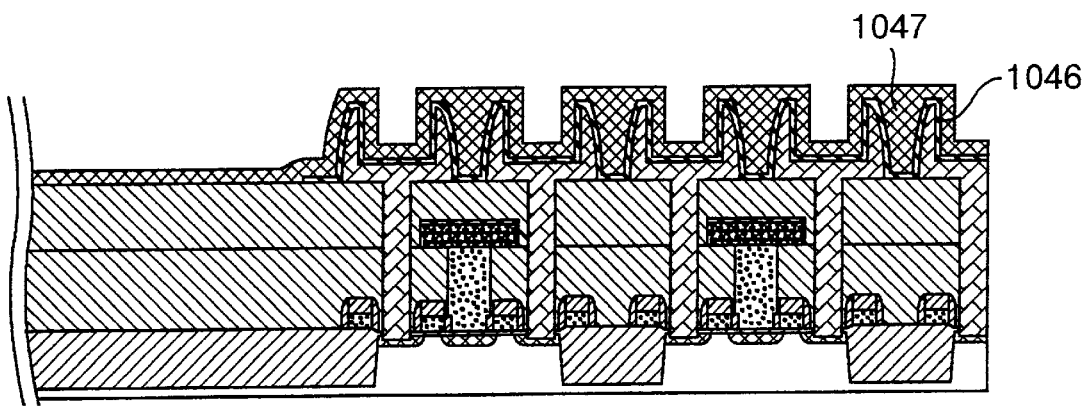
Figure 23B:
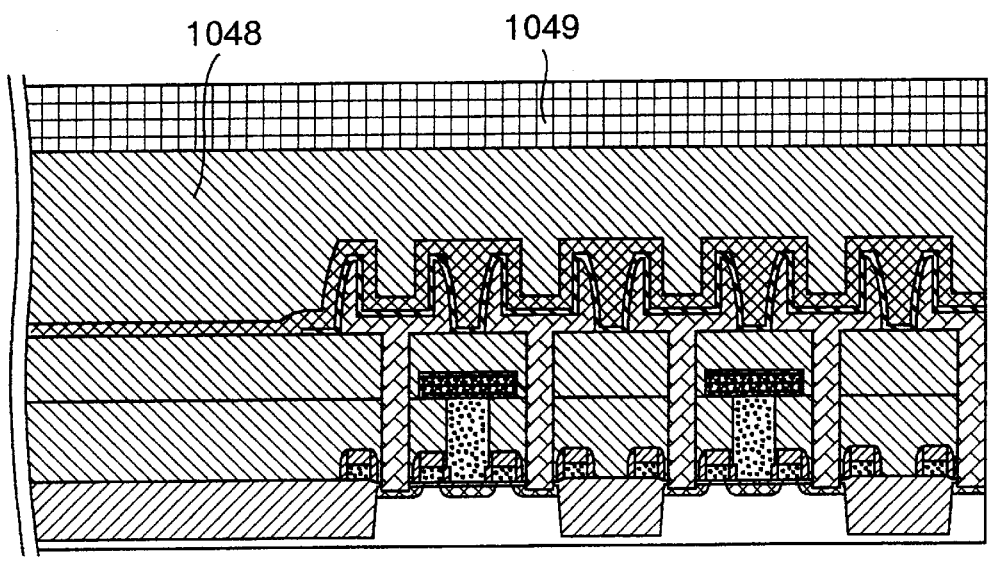

Then, a plate electrode 1047 comprising a dielectric film 1046 and a tungsten film was deposited and then patterned (FIG. 23a). Here, as the dielectric film 1046, a silicon nitride film, tantalum pentaoxide having a large dielectric constant as compared with that of the silicon oxide film should be preferable. Further, the film thickness of the dielectric film 1046 that was converted into the film thickness of the oxide film should preferably made less than 3 nano-meter. While the polycrystalline silicon in which impurities were heavily doped as used as the crown-like lower electrode 1045, it is possible to use a high-melting point metal film of low resistance value such as tungsten, titanium nitride film or the like. In the end, there were formed a silicon oxide film 1048 as an interlayer insulator and a metal interconnection 1049 (FIG. 23b).

Figure 25:
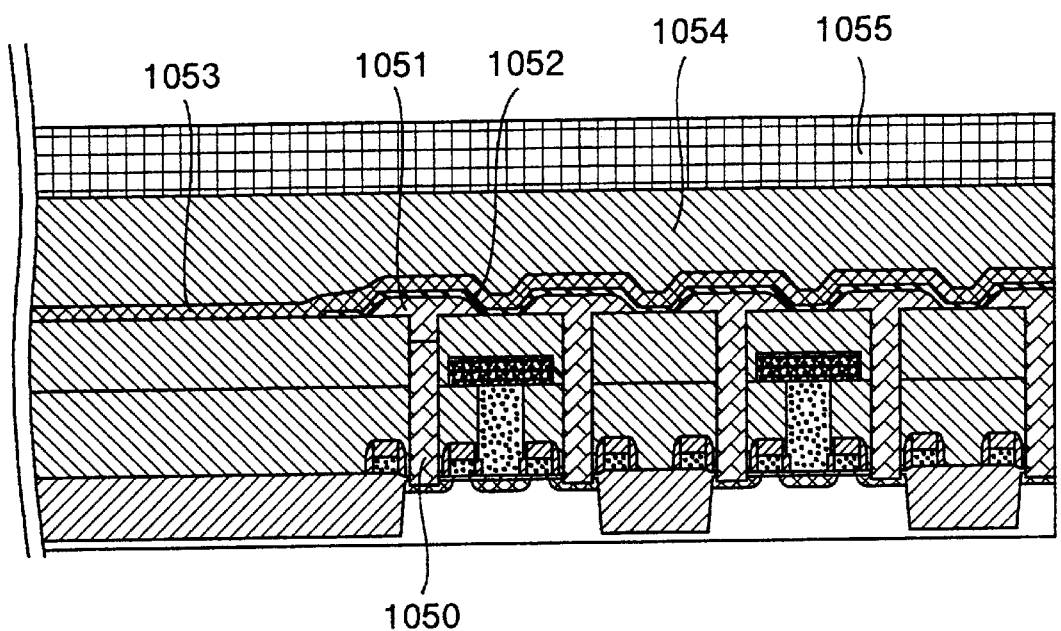

While the DRAM using the crown-like capacitor was described so far in the above-mentioned examples, it is needless to say that the present invention may be applied to a DRAM having a stack-type structure using a high-dielectric film 1052 shown in FIG. 25. In FIG. 25, a plug 1050 connected to a lower electrode 1053 and a lower electrode 1051 of a capacitor were formed of titanium nitride. As the material of the high-dielectric film 1052, there may be used well-known high-dielectric film such as SrTiO$_3$ and (Ba, Sr)TiO$_3$ film (BST film) and further a ferroelectric film such as PZT.

Incidentally, in addition to the techniques enumerated in the conventional techniques, with respect to the technique in which the film formed on the dense uneven pattern was partly removed and the sample was chemically mechanically polished, there are techniques disclosed in JP-A-10-13521 (laid-open at May 22, 1998), JP-A-10-321625 (laid-open at Dec. 4, 1998) and JP-A-10-321628 (laid-open at Dec. 4, 1998). Of these techniques disclosed in JP-A-10-321625 and JP-A-10-321628, the chemical mechanical polishing executed up to the convex portion surface of the uneven pattern of the under layer was not taken into consideration. Also, with respect to the technique disclosed in JP-A-10-135211, the polishing stopper formed on the convex portion surface of the uneven pattern of the under layer was not taken into consideration.

According to the above-mentioned inventive examples, the film thickness of the silicon nitride film used as the polishing stopper on the active region can be reduced so that the electrical element isolation characteristic of the field region can be improved. Since the concentration of the load of the chemical mechanical polishing can be dispersed, it is possible to suppress the occurrence of scratches considerably. Further, the silicon substrate and the gate electrode can be prevented from being exposed near the central portion of the memory mat and the insulating film on the silicon nitride film can be prevented from being left near the outer periphery upon chemical mechanical polishing. Thus, it is possible to form elements having uniform electrical characteristics on all active regions of the memory mat portion.

When the pillars are formed, only the pattern of the mask used in the etching of the conventional insulating film need be changed so that photolithography and other process need not be added, thereby making it possible to prevent the cost from increasing.

Incidentally, while the DRAM was described as the example in the inventive example 7, the present invention is not limited to the DRAM and may be very effectively applied to an SRAM (Static Random Access Memory) and a system LSI (Large Scale Integrated circuit) having a flash memory or DRAM mounted thereon.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing a semiconductor device having a memory mat region, comprising the steps of:
    forming a gate insulating film on an active region of a semiconductor substrate;
    depositing a gate electrode material film on said gate insulating film on said active region of said semiconductor substrate;
    depositing a polishing stopper film on said gate electrode material film;
    forming a plurality of gate electrodes by patterning a laminated film of said gate electrode material film and said polishing stopper film;
    forming source-drain regions on both sides of each said gate electrode in said active region;
    forming side wall films on side surfaces of each said gate electrode;
    depositing an interlayer insulator so as to fill a space between said gate electrodes;
    partially removing said interlayer insulator from said memory mat region by etching; and
    chemically mechanically polishing said interlayer insulator until said polishing stopper film is exposed.

2. A method according to claim 1, wherein corners of said insulating film surrounding said memory mat region and a plurality of pillars of said insulating film are formed within said memory mat region in the process in which said insulating film is partially removed by etching.

3. A method according to claim 2, wherein said corners and said pillars are formed in such a manner that a volume of said insulating film to be polished in the outside of said memory mat region and volumes of said corners and said pillars are equal to each other.

4. A method according to claim 1, wherein the gate electrode material film is any one of a laminated film of a polycrystalline silicon film, a polycrystalline silicon film and a metal silicide film or a laminated film of a polycrystalline silicon film and a metal film.

5. A method according to claim 1, wherein said polishing stopper film is a silicon nitride film.

6. A method according to claim 1, wherein said insulating film is a silicon oxide film.

7. A method according to claim 6, wherein said insulating film is deposited by CVD using $O_3$—TEOS.

8. A method according to claim 6, wherein said insulating film is deposited by HDP.

9. A method of manufacturing a DRAM having a memory mat portion and a peripheral circuit portion, comprising the steps of:
    forming a thermal oxide film on a semiconductor substrate surface;
    depositing a first nitride film on said thermal oxide film;
    patterning said first nitride film in accordance with an active region;
    etching said thermal oxide film and said silicon substrate with said patterned first silicon nitride film used as a mask to form grooves in a field region;
    depositing a first insulating film;
    partially etching said first insulating film formed on said memory mat portion in such a manner that a plurality of pillars of said first insulating film are left within said memory mat portion;
    exposing said patterned first silicon nitride film by chemical mechanical polishing;
    removing said exposed first silicon nitride film;
    forming a gate insulating film in said active region by removing said thermal oxide film from said active region;
    depositing a gate electrode material film on said semiconductor substrate;
    depositing a second nitride film on said gate electrode material film;
    forming a plurality of gate electrodes by patterning a laminated film of said material film and said second silicon nitride film in such a manner that two gate electrodes cross at least one active region of said memory mat portion;
    forming source-drain regions on both sides of each said gate electrode of said active region;
    depositing a third silicon nitride film on said semiconductor substrate;
    leaving the third silicon nitride film on a side surface of each said gate electrode by anisotropy-etching said third silicon nitride film;
    depositing a second insulating film;
    partially etching said second insulating film on said memory mat portion in such a manner that a plurality of pillars of said second insulating film are left within said memory mat portion;
    chemically mechanically polishing said second insulating film until said second silicon nitride film on each said gate electrode is exposed;
    depositing a third insulating film;
    forming a plurality of first plugs penetrating said second and third insulating films and which are connected to a source-drain region formed between two gate electrodes of each active region of said memory mat portion;
    forming a metal interconnection connected to said first plugs;
    depositing a fourth insulating film;
    forming a plurality of second plugs penetrating said second, third and fourth insulating films and which are connected to each source-drain region formed on the outside of two gate electrodes of each active region of said memory mat portion; and
    forming a capacitor connected to said second plugs.

* * * * *